(12) United States Patent
Fukuda

(10) Patent No.: US 10,935,214 B2
(45) Date of Patent: Mar. 2, 2021

(54) LIGHT-EMITTING DEVICE AND ELECTRONIC APPARATUS

(71) Applicant: JOLED Inc., Tokyo (JP)

(72) Inventor: Toshihiro Fukuda, Tokyo (JP)

(73) Assignee: JOLED INC., Tokyo (JP)

(*) Notice: Subject to any disclaimer, the term of this patent is extended or adjusted under 35 U.S.C. 154(b) by 0 days.

(21) Appl. No.: 16/455,780

(22) Filed: Jun. 28, 2019

(65) Prior Publication Data

US 2020/0041099 A1 Feb. 6, 2020

(30) Foreign Application Priority Data

Jul. 31, 2018 (JP) .............................. JP2018-144386

(51) Int. Cl.
| | | |
|---|---|---|
| *H01L 29/20* | (2006.01) | |
| *F21V 9/08* | (2018.01) | |
| *H01L 27/32* | (2006.01) | |
| *H01L 51/52* | (2006.01) | |

(52) U.S. Cl.
CPC .............. *F21V 9/08* (2013.01); *H01L 27/322* (2013.01); *H01L 27/3216* (2013.01); *H01L 51/5265* (2013.01); *H01L 51/5284* (2013.01)

(58) Field of Classification Search
CPC ............... H01L 27/3216; H01L 27/322; H01L 51/5265; H01L 51/5284; F21V 9/08
See application file for complete search history.

(56) References Cited

U.S. PATENT DOCUMENTS

| | | | |
|---|---|---|---|
| 2003/0169469 A1* | 9/2003 | Takada ..................... | G02B 5/32 359/15 |
| 2010/0117528 A1* | 5/2010 | Fukuda ................. | H01L 27/322 313/505 |
| 2011/0043096 A1 | 2/2011 | Asaki | |
| 2011/0062859 A1* | 3/2011 | Kawamura ........... | H01L 27/322 313/504 |
| 2012/0182290 A1* | 7/2012 | Takahashi .............. | H04N 13/31 345/419 |

FOREIGN PATENT DOCUMENTS

JP      2011-040352 A      2/2011

* cited by examiner

*Primary Examiner* — Phuc T Dang
(74) *Attorney, Agent, or Firm* — Xsensus LLP

(57) ABSTRACT

A light-emitting device includes pixels each including subpixels. Each subpixel includes light-emitting elements that emit respective pieces of light of colors different from each other, and a light-shielding film having openings at respective positions where the openings are opposed to the respective light-emitting elements at predetermined intervals. The openings have respective widths different from each other. The widths of the respective openings in a first direction and a second direction are sized to allow the light-shielding film to block a portion of the pieces of light emitted from the respective light-emitting elements and thereby to cause a 45-degree luminance viewing angle to be different between the first and second directions, and are sized to cause color differences (Δu'v') at a 45-degree chromaticity viewing angle (u'v') in the first and second directions to be 0.020 or less. The 45-degree luminance viewing angle is expressed in a unit of cd/m².

8 Claims, 11 Drawing Sheets

|  | RED PIXEL | GREEN PIXEL | BLUE PIXEL |
|---|---|---|---|
| LUMINANCE VIEWING ANGLE (45 DEGREES) IN HORIZONTAL DIRECTION | 70.0% | 68.0% | 68.0% |
| LUMINANCE VIEWING ANGLE (45 DEGREES) IN VERTICAL DIRECTION | 65.0% | 65.0% | 66.0% |
| $\Delta L = ((Lmax - Lmin)/Lmax) \times 100$ | 7.1% | 4.4% | 2.9% |

LIGHT-EMITTING DEVICE AND ELECTRONIC APPARATUS

CROSS REFERENCE TO RELATED APPLICATION

This application claims the benefit of Japanese Priority Patent Application No. 2018-144386 filed on Jul. 31, 2018, the entire contents of which are incorporated herein by reference.

BACKGROUND

The disclosure relates to a light-emitting device and an electronic apparatus.

Display devices including self-luminous elements such as organic electro-luminescence (EL) elements for each pixel sometimes adopt color filters having a black matrix to secure a wide color reproduction range, and suppress or prevent reflection of external light. Reference is made to Japanese Unexamined Patent Application Publication No. 2011-040352.

SUMMARY

For achieving higher resolution of a display device, it is desired for the display device to suppress or prevent a decrease in image grade when viewed from an oblique direction.

It is desirable to provide a light-emitting device and an electronic apparatus that make it possible to suppress or prevent a decrease in image grade for an achievement of higher resolution.

A light-emitting device according to one embodiment of the disclosure includes a plurality of pixels each including a plurality of subpixels. Each of the subpixels includes a plurality of light-emitting elements that emits respective pieces of light of colors different from each other, and a light-shielding film having a plurality of openings. The openings are provided at respective positions at which the openings are opposed to the respective light-emitting elements at a predetermined interval. The openings have respective widths that are different from each other. The widths of the respective openings in a first direction and a second direction are sized to allow the light-shielding film to block a portion of the pieces of light emitted from the respective light-emitting elements and thereby to cause a 45-degree luminance viewing angle in the first direction and a 45-degree luminance viewing angle in the second direction to be different. The 45-degree luminance viewing angle is expressed in a unit of $cd/m^2$. The widths of the respective openings in the first direction and the second direction are sized to cause color differences ($\Delta u'v'$) at a 45-degree chromaticity viewing angle (u'v') in the first direction and the second direction to be 0.020 or less.

An electronic apparatus according to one embodiment of the disclosure includes a light-emitting device as a display device. The light-emitting device includes a plurality of pixels each including a plurality of subpixels. Each of the subpixels includes a plurality of light-emitting elements that emits respective pieces of light of colors different from each other, and a light-shielding film having a plurality of openings. The openings are provided at respective positions at which the openings are opposed to the respective light-emitting elements at a predetermined interval. The openings have respective widths that are different from each other. The widths of the respective openings in a first direction and a second direction are sized to allow the light-shielding film to block a portion of the pieces of light emitted from the respective light-emitting elements and thereby to cause a 45-degree luminance viewing angle in the first direction and a 45-degree luminance viewing angle in the second direction to be different. The 45-degree luminance viewing angle is expressed in a unit of $cd/m^2$. The widths of the respective openings in the first direction and the second direction are sized to cause color differences ($\Delta u'v'$) at a 45-degree chromaticity viewing angle (u'v') in the first direction and the second direction to be 0.020 or less.

BRIEF DESCRIPTION OF THE DRAWINGS

The accompanying drawings are included to provide a further understanding of the disclosure and are incorporated in and constitute a part of this specification. The drawings illustrate example embodiments and, together with the specification, serve to explain the principles of the disclosure.

DETAILED DESCRIPTION

Figure 1:
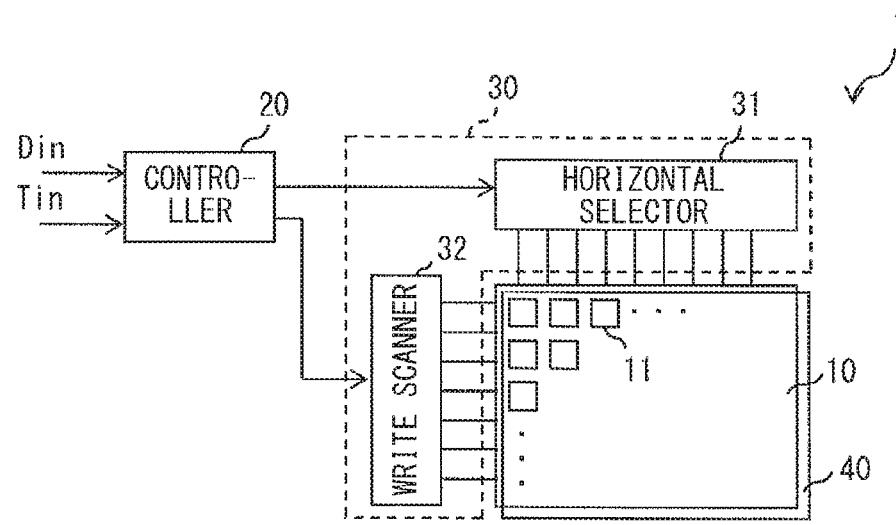
FIG. 1 is a schematic view of an example configuration of a display device according to one example embodiment of the disclosure.

In the following, some example embodiments of the disclosure are described in detail, in the following order, with reference to the accompanying drawings. Note that the following description is directed to illustrative examples of the disclosure and not to be construed as limiting to the disclosure. Factors including, without limitation, numerical values, shapes, materials, components, positions of the components, and how the components are coupled to each other are illustrative only and not to be construed as limiting to the disclosure. Further, elements in the following example embodiments which are not recited in a most-generic independent claim of the disclosure are optional and may be provided on an as-needed basis. The drawings are schematic and are not intended to be drawn to scale. Note that the like elements are denoted with the same reference numerals, and any redundant description thereof will not be described in detail.

[1. Embodiment]
[Configuration]

Figure 2:
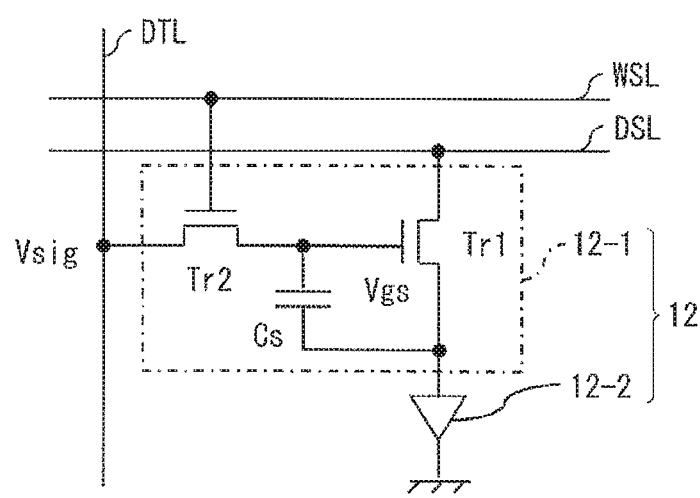
FIG. 2 is an example circuit diagram of one subpixel in each pixel illustrated in FIG. 1.

FIG. 1 is a schematic view of an example configuration of a light-emitting device 1 according to an example embodiment of the disclosure. FIG. 2 is an example circuit diagram of one subpixel 12 in each pixel 11 in the light-emitting device 1. The light-emitting device 1 may include a light-emitting panel 10, an opposite panel 40, a controller 20, and a driver 30. The light-emitting panel 10 may be laminated to the opposite panel 40 to form a laminated panel. The driver 30 may be mounted on an outer edge portion of the light-emitting panel 10, for example. The light-emitting panel 10 includes the pixels 11 that may be arranged in matrix. The controller 20 and the driver 30 may drive the light-emitting panel 10 (i.e., pixels 11) on the basis of an external image signal Din and an external synchronizing signal Tin.

[Light-Emitting Panel 10]

In response to the active-matrix driving of the pixels 11 performed by the controller 20 and the driver 30, the light-emitting panel 10 may display an image based on the external image signal Din and the external synchronizing signal Tin. The light-emitting panel 10 may include scanning lines WSL and power lines DSL extending in a row direction, and signal lines DTL extending in a column direction. The laminated panel including the light-emitting panel 10 and the opposite panel 40 (hereinafter simply referred to as "laminated panel") may include the pixels 11 that are arranged in matrix. The pixels 11 may be provided at respective intersections between the scanning lines WSL and the signal lines DTL.

The scanning lines WSL may serve to select the pixels 11. In an example, the scanning lines WSL may supply the respective pixels 11 with a selection pulse Pw to select the pixels 11 on a predetermined unit basis, for example, a pixel-row basis. The signal lines DTL may serve to supply the respective pixels 11 with a data pulse that includes a signal voltage Vsig based on the image signal Din. The power lines DSL may serve to supply the respective pixels 11 with electric power.

Each of the pixels 11 may include, for example, a subpixel 12R that emits red light, a subpixel 12G that emits green light, and a subpixel 12B that emits blue light. The following generically refers to the subpixel 12R, the subpixel 12G, and the subpixel 12B as subpixels 12. Each of the pixels 11 may serve as a unit of color image display. Each of the pixels 11 may further include a subpixel 12 that emits light of another color, such as white or yellow, for example. Alternatively, each of the pixels 11 may include, for example, subpixels 12 of the same color, such as two subpixels 12 that emit green light. The subpixels 12 may be aligned in line in a predetermined direction such as the row direction in each of the pixels 11.

Each of the signal lines DTL may be coupled to an output terminal of a horizontal selector 31 described below. Each of the signal lines DTL may be allocated to its corresponding pixel column, for example. Each of the scanning lines WSL may be coupled to an output terminal of a write scanner 32 described below. Each of the scanning lines WSL may be allocated to its corresponding pixel row, for example. Each of the power lines DSL may be coupled to an output terminal of a power source. Each of the power lines DSL may be allocated to its corresponding pixel rows, for example.

Each of the subpixels 12 may include a pixel circuit 12-1 and a light-emitting element 12-2. An example configuration of the light-emitting element 12-2 will be described in detail below.

The pixel circuit 12-1 may control light emission and light extinction of the light-emitting element 12-2. The pixel circuit 12-1 may hold a voltage written into the subpixel 12 by write scanning described below. The pixel circuit 12-1 may include, for example, a driving transistor Tr1, a switching transistor Tr2, and a storage capacitor Cs.

The switching transistor Tr2 may control application of the signal voltage Vsig to a gate of the driving transistor Tr1. The signal voltage Vsig may correspond to the image signal Din. For example, the switching transistor Tr2 may sample a voltage of the signal line DTL, and may write the sampled voltage to the gate of the driving transistor Tr1. The driving transistor Tr1 may be coupled in series to the light-emitting element 12-2. The driving transistor Tr1 may drive the light-emitting element 12-2. The driving transistor Tr1 may control an electrical current flowing in the light-emitting element 12-2 on the basis of a magnitude of the voltage sampled by the switching transistor Tr2. The storage capacitor Cs may hold a predetermined voltage between the gate and a source of the driving transistor Tr1. The storage capacitor Cs may hold a voltage Vgs between the gate and the source of the driving transistor Tr1 at a constant level for a predetermined period of time. Note that the pixel circuit 12-1 may have the 2Tr1C circuit configuration described above and additional capacitors and transistors. Alternatively, the pixel circuit 12-1 may have a circuit configuration different from the 2Tr1C circuit configuration described above.

Each of the signal lines DTL may be coupled to the output terminal of the horizontal selector 31 described below and the source or drain of the switching transistor Tr2. Each of the scanning lines WSL may be coupled to the output terminal of the write scanner 32 and the gate of the switching transistor Tr2 described below. Each of the power lines DSL may be coupled to a power supply circuit and the source or the drain of the driving transistor Tr1.

The gate of the switching transistor Tr2 may be coupled to the scanning line WSL. One of the source or drain of the switching transistor Tr2 may be coupled to the signal line DTL. The other of the source or drain, uncoupled to the signal line DTL, of the switching transistor Tr2 may be coupled to the gate of the driving transistor Tr1. One of the source or drain of the driving transistor Tr1 may be coupled to the power line DSL. The other of the source or drain, uncoupled to the power line DSL, of the driving transistor Tr1 may be coupled to an anode 21 of the light-emitting element 12-2. The anode 21 will be described below. One terminal of the storage capacitor Cs may be coupled to the gate of the driving transistor Tr1. The other end of the storage capacitor Cs may be coupled to one of the source or drain, adjacent to the light-emitting element 12-2, of the driving transistor Tr1.

[Driver 30]

The driver 30 may include, for example, the horizontal selector 31 and the write scanner 32. The horizontal selector 31 may apply an analog signal voltage Vsig received from the controller 20 to each of the signal lines DTL in response to (in synchronization with) an input of a control signal, for example. The write scanner 32 may scan the pixels 11 on a predetermined unit basis.

[Controller 20]

The controller 20 will now be described. The controller 20 may perform, for example, a predetermined correction of a digital image signal Din received from an external device, and may generate a signal voltage Vsig on the basis of the corrected image signal. The controller 20 may output the generated signal voltage Vsig to the horizontal selector 31, for example. The controller 20 may output a control signal to each circuit in the driver 30 in response to (in synchronization with) a synchronizing signal Tin received from an external device.

Figure 3:
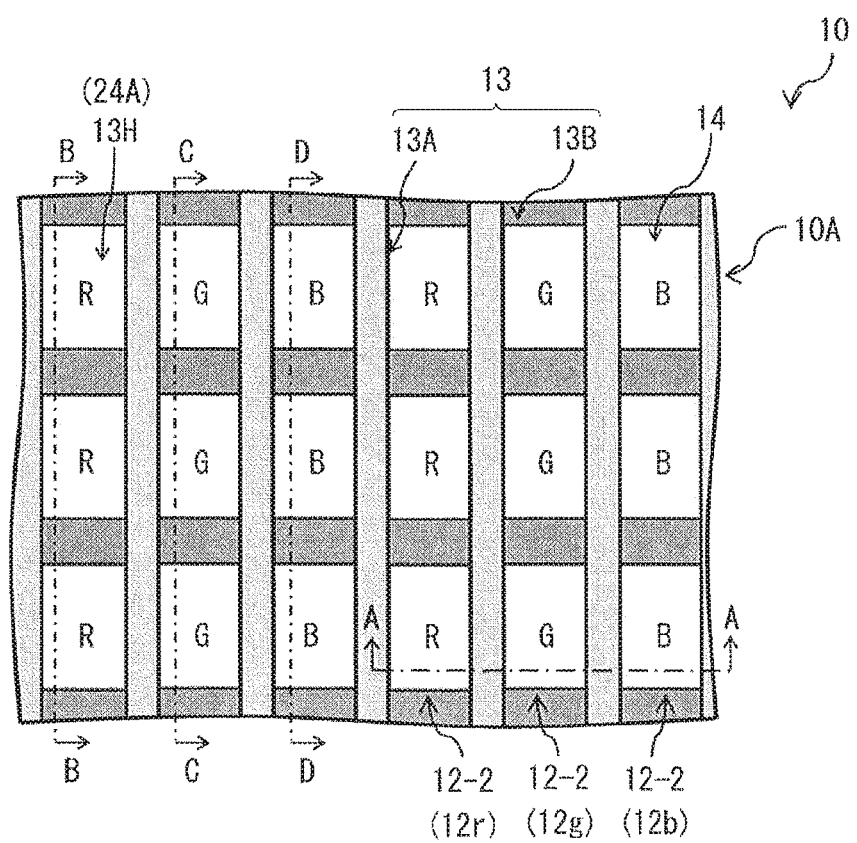
FIG. 3 is a schematic view of an example configuration of a light-emitting panel illustrated in FIG. 1.
Figure 4:
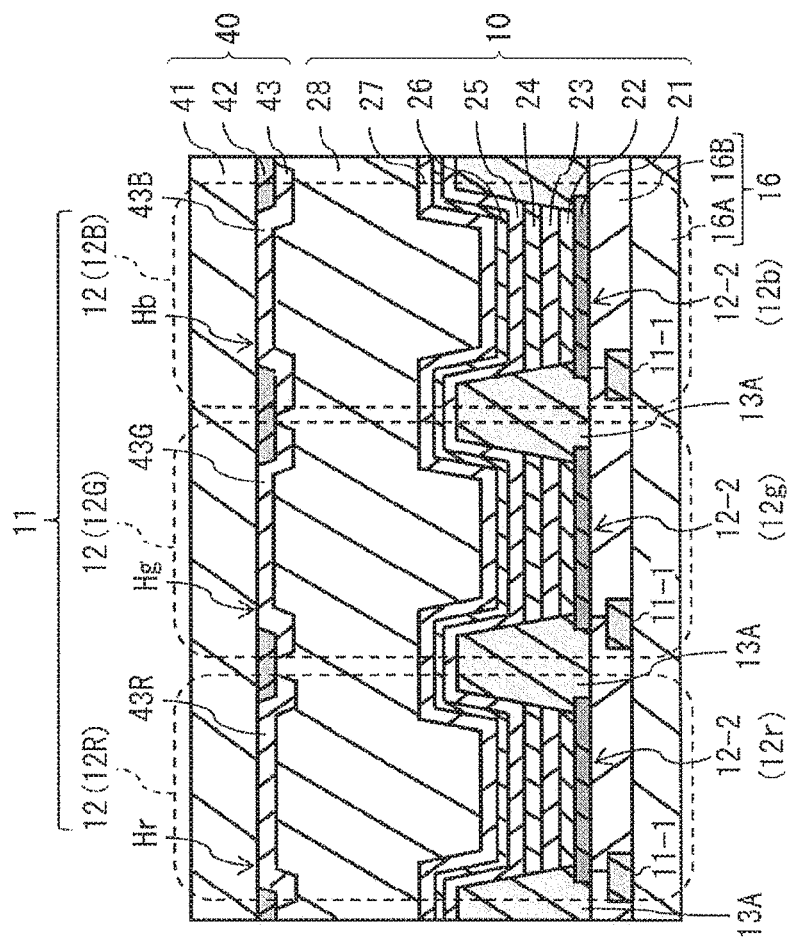
FIG. 4 is a cross-sectional view of an example configuration of a laminated panel taken along the line A-A of the light-emitting panel in FIG. 3.
Figure 5:
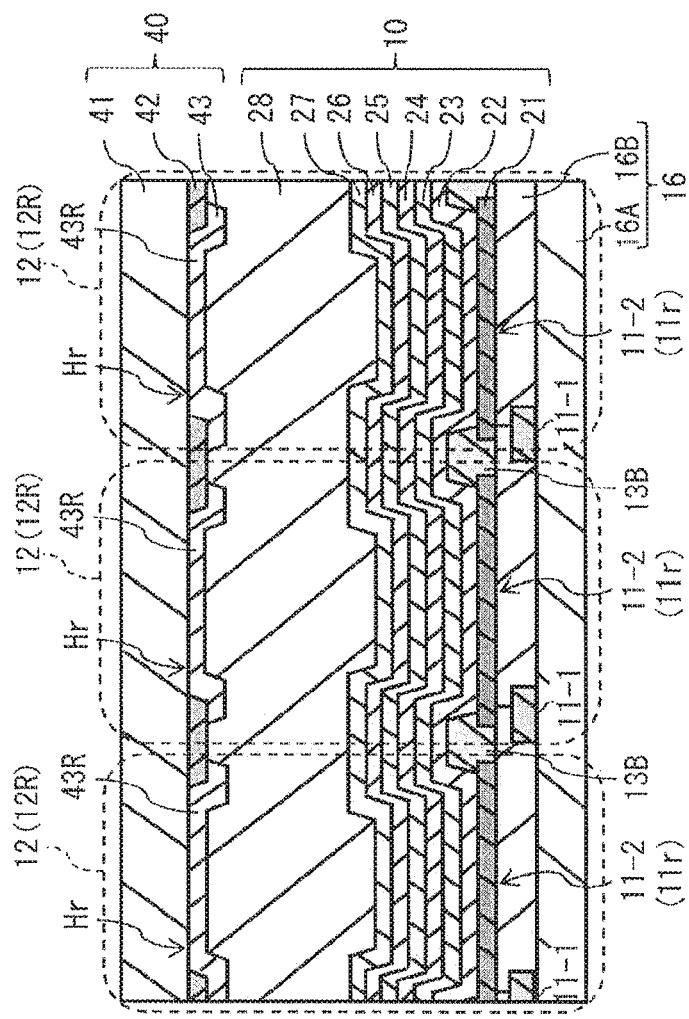
FIG. 5 is a cross-sectional view of an example configuration of the laminated panel taken along the line B-B of the light-emitting panel in FIG. 3.

With reference to FIGS. 3 to 5, the light-emitting elements 12-2 will now be described. FIG. 3 is a plan view of an example configuration of a display region 10A of the light-emitting panel 10. The display region 10A of the light-emitting panel 10 may be a region on which an image is displayed. Each of FIGS. 4 and 5 is a cross-sectional view of example configurations of the light-emitting panel 10 and the opposite panel 40. FIG. 4 is a cross-sectional view of an example configuration of the light-emitting panel 10 taken along the line A-A in FIG. 3. FIG. 5 is a cross-sectional view of an example configuration of the light-emitting panel 10 taken along the line B-B in FIG. 3.

The laminated panel may include the pixels 11 that are arranged in matrix. Each of the pixels 11 in the laminated panel may include the subpixel 12R, the subpixel 12G, and the subpixel 12B, as described above. Optionally, each of the pixels 11 may further include a subpixel 12 that emits light of another color, such as white or yellow, as described above. Alternatively, each of the pixels 11 may include, for example, subpixels 12 of the same color, such as two subpixels 12G that emit green light.

The subpixel 12R may include the light-emitting element 12-2 (12r) that emits red light. The subpixel 12G may include the light-emitting element 12-2 (12g) that emits green light. The subpixel 12B may include the light-emitting element 12-2 (12b) that emits blue light. The subpixels 12R, 12G, and 12B may be arranged in a stripe pattern. The subpixels 12R, 12G, and 12B may be disposed on a color basis in the row direction. The subpixels 12 that emit light of the same color may be disposed along the column direction in each pixel column.

The light-emitting elements 12-2 may be arranged at an equal pitch in the row direction. Additionally, the light-emitting elements 12-2 may be arranged at an equal pitch in the column direction. The light-emitting elements 12-2 may have a constant pitch along the row direction. The light-emitting elements 12-2 may have a constant pitch along the column direction. The pitch of the light-emitting elements 12-2 along the row direction may be narrower than that of the light-emitting elements 12-2 along the column direction.

For example, the pitch of the light-emitting elements 12-2 along the row direction may be about a third of the pitch of the light-emitting elements 12-2 along the column direction. The resolution (i.e., pitch of the light-emitting elements 12-2 along the row direction) of the light-emitting elements 12-2 may be 100 ppi or more, 120 ppi or more, or 150 ppi or more, for example.

In a case where the resolution (i.e., pitch of the light-emitting elements 12-2 along the row direction) of the light-emitting elements 12-2 is less than 100 ppi, eliminating vignetting (i.e., light shielding) in a black matrix 42 may allow a shift of a chromaticity viewing angle (u'v') in a visual recognition direction to be corrected. The black matrix 42 will be described below. Meanwhile, the example embodiment of the disclosure assumes definition at which it is difficult in the first place to eliminate vignetting (light shielding) in the black matrix 42. Specific but non-limiting examples of the range of such definition may include 100 ppi or more, 120 ppi or more, or 150 ppi or more, as described above. In this way, the example embodiment of the disclosure may assume a situation in which it is difficult in the first place to eliminate vignetting (light shielding) in the black matrix 42, which could not occur in low-definition devices. On the basis of the assumption, the example embodiment of the disclosure may propose how to correct a shift of the chromaticity viewing angle (u'v') in a visual recognition direction. The definition may have a gradual range of 100 ppi or more, 120 ppi or more, or 150 ppi or more, as described above. One reason for this is that the chromaticity viewing angle (u'v') may shift more in a visual recognition direction with an increase in definition, and an acceptable range of the shift of the chromaticity viewing angle (u'v') in the visual recognition direction may be different depending on the specifications.

The light-emitting panel 10 may include a substrate 16. The substrate 16 may include a base 16A, and a wiring layer 16B. In one example, the base 16A may support each of the light-emitting elements 12-2 and an insulating layer 13. The wiring layer 16B may be provided on the base 16A. For example, the base 16A may include a light-transmissive substrate such as a transparent substrate that transmits light. The base 16A may include, for example, non-alkali glass, soda glass, nonfluorescent glass, phosphate glass, borate glass, or quartz. Alternatively, the base 16A may include, for example, acrylic resin, styrene resin, polycarbonate resin, epoxy resin, polyethylene, polyester, silicone resin, or alumina. The wiring layer 16B may have, for example, the pixel circuit 12-1 of each of the pixels 11. The wiring layer 16B may have a planarizing film in which the pixel circuit 12-1 of each of the subpixels 12 is buried. For example, the substrate 16 may have a quadrangular shape.

The light-emitting panel 10 may further include the insulating layer 13 on the substrate 16. The insulating layer 13 may define each of the subpixels 12. In one example, an upper limit thickness of the insulating layer 13 may be within a range that allows for shape control of the insulating layer 14 during the manufacture of the insulating layer 14, in consideration of variations in film thickness and control of a bottom line width. For example, the upper limit thickness of the insulating layer 14 may be 10 μm or smaller. In another example, the upper limit thickness of the insulating layer 13 may be within a range that suppresses an increase in tact time with an increase in exposure time in an exposing process and that suppresses a reduction in productivity on mass production lines. For example, the upper limit thickness of the insulating layer 14 may be 7 μm or smaller. Additionally, a lower limit thickness of the insulating layer 13 may be determined on the basis of resolution limits of an exposure device and a material, for example. One reason for this is that as the film thickness becomes smaller, the bottom line width is to be adjusted to substantially the same extent as the film thickness, in this example. In one example where the insulating layer 13 is manufactured using a semiconductor stepper, the lower limit thickness of the insulating layer 13 may be 1 μm or greater. In another example where the insulating layer 13 may be manufactured using a flat-panel stepper and a scanner, the lower limit thickness of the insulating layer 13 may be 2 μm or greater. Accordingly, the insulating layer 13 may have a thickness within a range from 1 μm to 10 μm. Alternatively, the insulating layer 13 may have a thickness within a range from 2 μm to 7 μm.

The insulating layer 13 may include column regulators 13A and row regulators 13B. The column regulators 13A and the row regulators 13B may define the subpixels 12. FIG. 3 illustrates the row regulators 13B in black, and the column regulators 13A in gray. The column regulators 13A may each correspond to a specific but non-limiting example of "pixel regulator" according to one embodiment of the disclosure.

Each of the column regulators 13A may extend in the column direction. Each of the row regulators 13B may extend in the row direction in which the row regulators 13B are orthogonal to the respective column regulators 13A. The column direction may correspond to a specific but non-limiting example of "second direction" according to one embodiment of the disclosure. The row direction may correspond to a specific but non-limiting example of "first direction" according to one embodiment of the disclosure. The column regulators 13A extending in the column direction may be disposed side by side to each other at a predetermined interval along the row direction. The column regulators 13A may each define two of the subpixels 12 that are adjacent to each other in the row direction. The row regulators 13B extending in the row direction may be disposed side by side to each other at a predetermined interval along the column direction. The column regulators 13A may intersect the respective row regulators 13B to form a grid-pattern. For example, the column regulators 13A may be orthogonal to the respective row regulators 13B. Each of the subpixels 12 may be surrounded by two of the column regulators 13A that are adjacent to each other and two of the row regulators 13B that are adjacent to each other. Accordingly, the subpixels 12 may be defined by the column regulators 13A and the row regulators 13B.

The insulating layer 13 may have openings 13H in a region surrounded by two of the column regulators 13A that are adjacent to each other and two of the row regulators 13B that are adjacent to each other. A surface of the anode 21 described below may be exposed at the bottom of each of the openings 13H. This allows holes supplied from the anode 21 exposed at the bottom of each opening 13H to be recombined with respective electrons supplied from the cathode 27 described below in a light-emitting layer 24, causing the light-emitting layer 24 to emit light. The light-emitting layer 24 will be described below. Accordingly, the light-emitting layer 24 may have light-emitting regions 24A opposed to the respective openings 13H. In other words, the column regulators 13A may define the widths of the respective light-emitting elements 12-2 in the row direction, and the row regulators 13B may define the widths of the respective light-emitting elements 12-2 in the column direction.

The openings 13H in the insulating layer 13 may have a constant pitch in the row direction. The openings 13H in the insulating layer 13 may have a constant pitch in the column direction. The pitch of the openings 13H along the row direction may be equal to that of the light-emitting elements 12-2 along the row direction. The pitch of the openings 13H along the column direction may be equal to that of the light-emitting elements 12-2 along the column direction. The pitch of the openings 13H along the row direction may be narrower than that of the openings 13H along the column direction. For example, the pitch of the openings 13H along the row direction may be about a third of the pitch of the openings 13H along the column direction.

The light-emitting regions 24A in the subpixels 12R, 12G, and 12B may be different in size from each other. The light-emitting region 24A in the subpixel 12R may be larger than the light-emitting region 24A in the subpixel 12G. The light-emitting region 24A in the subpixel 12G may be larger than the light-emitting region 24A in the subpixel 12B. One reason for this is that the light of the portion where the film thickness of the light-emitting layer 24 does not satisfy a resonance condition is not extractable due to influence of a microcavity described below.

In one example illustrated in FIGS. 4 and 5, for example, the row regulator 13B may have a height (from the substrate 16) smaller than the height (from the substrate 16) of the column regulator 13A. For example, the height of the row regulator 13B (from the substrate 16) may be equal to or smaller than half the distance between the anode 21 and the cathode 27 in the light-emitting element 12-2. In this example, the subpixels 12 disposed in the column direction may be provided in a strip groove 14 defined by two of the column regulators 13A opposite to each other, and may share layers each including a coated film, such as a hole injection layer 22, a hole transport layer 23, and the light-emitting layer 24 described below. The subpixels 12 disposed in the column direction may be provided along the column regulators 13A, for example, as illustrated in FIGS. 4 and 5.

The insulating layer 13 may include, for example, an insulating organic material. Specific but non-limiting examples of the insulating organic material may include acrylic resin, polyimide resin, and novolac phenol resin. In one example, the insulating layer 13 may include an insulating resin that is resistant to heat and a solvent. The column regulators 13A and the row regulators 13B may be formed by processing an insulating resin into a desired pattern by means of photolithography and developing, for example. The column regulators 13A may each have a forward tapered shape in cross-sectional view, as illustrated in FIG. 4, for example. The row regulators 13B may each have a forward tapered shape in cross-sectional view, as illustrated in FIG. 5.

A region surrounded by two of the column regulators 13A that are parallel to each other and adjacent to each other may serve as the groove 14. A surface of each of the column regulators 13A may relatively have a liquid-repellent characteristic as compared with a surface of each of the row regulators 13B. Accordingly, the column regulators 13A may each suppress or prevent an inflow of ink from one groove 14 to another adjacent groove 14, for example, during formation of the hole injection layer 22, the hole transport layer 23, and the light-emitting layer 24 by coating. The liquid-repellent characteristic of each of the column regulators 13A may be offered by the water-repellent characteristic of resin. Alternatively, the liquid-repellent characteristic of each of the column regulators 13A may be offered by imparting a liquid-repellent characteristic to a resin surface, for example, through fluorine plasma treatment. Each of the row regulators 13B may relatively have a lyophilic characteristic as compared with each of the column regulators 13A. Accordingly, each of the row regulators 13B may not prevent ink from flowing and spreading in the groove 14, for example, during formation of the hole injection layer 22, the hole transport layer 23, and the light-emitting layer 24 by coating. For example, each column regulator 13A and each row regulator 13B may be formed in respective processes that are different from each other.

Each of the light-emitting elements 12-2 may include, in order, on the substrate 16, the anode 21, the hole injection layer 22, the hole transport layer 23, the light-emitting layer 24, an electron transport layer 25, an electron injection layer 26, and the cathode 27, for example.

The light-emitting element 12-2 may include the anode 21, the light-emitting layer 24, and the cathode 27. The light-emitting layer 24 may be provided between the anode 21 and the cathode 27, for example. The light-emitting element 12-2 may further include, in order from the anode 21, the hole injection layer 22 and the hole transport layer 23 that are provided between the anode 21 and the light-emitting layer 24, for example. Note that one or both of the hole injection layer 22 and the hole transport layer 23 may be omitted. The light-emitting element 12-2 may further include, in order from the light-emitting layer 24, the electron transport layer 25 and the electron injection layer 26 that are provided between the light-emitting layer 24 and the cathode 27, for example. Note that one or both of the electron transport layer 25 and the electron injection layer 26 may be omitted. For example, the light-emitting element 12-2 may have a device structure that includes the anode 21, the hole injection layer 22, the hole transport layer 23, the light-emitting layer 24, the electron transport layer 25, the electron injection layer 26, and the cathode 27 in this order from the substrate 16. The light-emitting element 12-2 may further include additional functional layers.

The hole injection layer 22 may enhance efficiency in injecting holes. The hole transport layer 23 may transport holes injected from the anode 21 to the light-emitting layer 24. The light-emitting layer 24 may emit light of a predetermined color through recombination of electrons and holes. The electron transport layer 25 may transport electrons injected from the cathode 27 to the light-emitting layer 24. The electron injection layer 26 may enhance efficiency in injecting electrons. One or both of the hole injection layer 22 and the electron injection layer 26 may be omitted. The light-emitting element 12-2 may further include other layers in addition to the layers described above.

The anode 21 may be provided on the substrate 16, for example. The anode 21 may include, for example, aluminum (Al), silver (Ag), or an alloy of aluminum or silver. Alternatively, the anode 21 may include a reflective electrode having reflectivity. Note that the anode 21 may not be limited to a reflective electrode, but may also include, for example, a transparent electrode having transparency. Specific but non-limiting examples of a material of the transparent electrode may include a transparent electrically-conductive material such as indium tin oxide (ITO) or indium zinc oxide (IZO). The anode 21 may be a laminate of a reflective electrode and a transparent electrode. For example, an end portion of the anode 21 may be buried in the insulating layer 13. In one example where an end portion of the anode 21 is buried in the insulating layer 13, changing the size of each opening 13H such as the size of the bottom of each opening 13H may allow the size (i.e., area) of each pixel 11 or the size (i.e., area) of each light-emitting region 24A to be adjusted.

The cathode 27 may include a transparent electrode such as an ITO film. Note that the cathode 27 may not be limited to a transparent electrode, but may include a reflective electrode having light reflectivity. Specific but non-limiting examples of a material of the reflective electrode may include aluminum (Al), magnesium (Mg), silver (Ag), an aluminum-lithium alloy, or a magnesium-silver alloy. In an example embodiment of the disclosure where the substrate 16 and the anode 21 have reflectivity and the cathode 27 has transparency, the light-emitting elements 12-2 may each have a top-emission structure that emits light through the cathode 27. In another example embodiment of the disclosure where the substrate 16 and the anode 21 have transparency and the cathode 27 has reflectivity, the light-emitting elements 12-2 may each have a bottom-emission structure that emits light through the substrate 16.

The hole injection layer 22 may include an organic material such as an electrically-conductive polymeric material. The hole injection layer 22 may be formed by coating the anode 21 with an organic polymer solution of an electrically-conductive polymeric material, such as a mixture of polythiophene and polystyrene sulfonate (PEDOT), and drying the organic polymer solution. In this example, the hole injection layer 22 may include a coated film. In one example where the hole transport layer 23 is formed by coating, the hole injection layer 22 may include a material that is insoluble in a coating solution.

The hole transport layer 23 may transport holes injected from the anode 21 to the light-emitting layer 24. The hole transport layer 23 may be a coated film, for example. In one example, the hole transport layer 23 may be formed by coating and drying a solution that includes an organic material (hereinafter referred to as "hole transporting material 23M"), as a main solute. The hole transporting material 23M may transport holes injected from the anode 21 to the light-emitting layer 24. The hole transport layer 23 may mainly, but not necessarily mainly include the hole transporting material 23M. In one example where the light-emitting layer 24 is formed by coating, the hole transport layer 23 may include a material that is insoluble in a coating solution.

Specific but non-limiting examples of the hole transporting material 23M of the hole transport layer 23 may include an arylamine derivative, a triazole derivative, an oxadiazole derivative, an imidazole derivative, a polyarylalkane derivative, a pyrazoline derivative and a pyrazolone derivative, a phenylenediamine derivative, an amino-substituted chalcone derivative, an oxazole derivative, a styrylanthracene derivative, a fluorenone derivative, a hydrazone derivative, a stilbene derivative, a butadiene compound, a polystyrene derivative, a triphenylmethane derivative, a tetraphenylbenzene derivative, or any combination thereof. For example, the respective materials of the hole injection layer 22 and the hole transport layer 23 may have a difference of 0.5 eV or less in the highest occupied molecular orbital (HOMO) level, in consideration of a hole injecting property.

In the light-emitting layer 24, a hole injected from the anode 21 and an electron injected from the cathode 27 may be recombined with each other to generate an exciton in the light-emitting layer 24. This may cause the light-emitting layer 24 to emit light. The light-emitting layer 24 may be a coated layer, for example. In one example, the light-emitting layer 24 may be formed by coating and drying a solution that includes a solute that mainly, but not necessarily mainly includes an organic material generating excitons through the recombination of holes and electrons and thereby emitting light (hereinafter referred to as "organic light-emitting material 24M"). The light-emitting layer 24 may mainly, but not necessarily mainly include the organic light-emitting material 24M. A light-emitting element 12r in the subpixel 12R may include the organic light-emitting material 24M that includes a red organic light-emitting material. A light-emitting element 12g in the subpixel 12G may include the organic light-emitting material 24M that includes a green organic light-emitting material. A light-emitting element 12b in the subpixel 12B may include the organic light-emitting material 24M that includes a blue organic light-emitting material.

The light-emitting layer 24 may have a monolithic organic light-emitting layer, or a laminate of a plurality of organic light-emitting layers, for example. In one example where the light-emitting layer 24 has a laminate of the organic light-emitting layers, the light-emitting layer 24 may be a laminate of coated layers that include a common main component. The organic light-emitting layers may be formed by coating and drying a solution that includes the organic light-emitting material 24M as a main solute.

In one example, the organic light-emitting material 24M of the light-emitting layer 24 may include a single dopant material. In another example, the organic light-emitting material 24M may include a host material and a dopant material in combination. In other words, the light-emitting layer 24 may include, as the organic light-emitting material 24M, the host material and the dopant material. The host material may mainly, but not necessarily mainly serve to transport electrical charges of electrons or holes, and the dopant material may mainly, but not necessarily mainly serve to emit light. In still another example, the organic light-emitting material 24M may include two or more host materials and two or more dopant materials in combination. For example, the amount of the dopant material may be within a range from 0.01 weight percent to 30 weight percent relative to the amount of the host material. Alternatively, the amount of the dopant material may be within a range from 0.01 weight percent to 10 weight percent relative to the amount of the host material.

Specific but non-limiting examples of the host material of the light-emitting layer 24 may include an amine compound, a condensed polycyclic aromatic compound, and a heterocyclic compound. Specific but non-limiting examples of the amine compound may include a monoamine derivative, a diamine derivative, a triamine derivative, and a tetraamine derivative. Specific but non-limiting examples of the condensed polycyclic aromatic compound may include an anthracene derivative, a naphthalene derivative, a naphthacene derivative, a phenanthrene derivative, a chrysene derivative, a fluoranthene derivative, a triphenylene derivative, a pentacene derivative, and a perylene derivative. Specific but non-limiting examples of the heterocyclic compound may include a carbazole derivative, a furan derivative, a pyridine derivative, a pyrimidine derivative, a triazine derivative, an imidazole derivative, a pyrazole derivative, a triazole derivative, an oxazole derivative, an oxadiazole derivative, a pyrrole derivative, an indole derivative, an azaindole derivative, an azacarbazole derivative, a pyrazoline derivative, a pyrazolone derivative, and a phthalocyanine derivative.

Specific but non-limiting examples of the dopant material of the light-emitting layer 24 may include a pyrene derivative, a fluoranthene derivative, an arylacetylene derivative, a fluorene derivative, a perylene derivative, an oxadiazole derivative, an anthracene derivative, and a chrysene derivative. Alternatively, the dopant material of the light-emitting layer 24 may include a metal complex. The metal complex may include a ligand and a metal atom of iridium (Ir), platinum (Pt), osmium (Os), gold (Au), rhenium (Re), or ruthenium (Ru), for example.

The electron transport layer 25 may transport electrons injected from the cathode 27 to the light-emitting layer 24. The electron transport layer 25 may mainly, but not necessarily mainly include an organic material having an electron transporting property (hereinafter referred to as "electron transporting material 25M"). The electron transport layer 25 may be, for example, a deposited film or a sputtered film. For example, the electron transport layer 25 may have an electrical charge blocking property of suppressing or preventing tunneling of electrical charges (e.g., holes in this example embodiment) from the light-emitting layer 24 to the cathode 27, and a property of suppressing or preventing light extinction of the light-emitting layer 24 in an excitation state.

The electron transporting material 25M of the electron transport layer 25 may include an aromatic heterocyclic compound containing one or more hetero atoms in a molecule, for example. The aromatic heterocyclic compound may contain, as a skeleton, a pyridine ring, a pyrimidine ring, a triazine ring, a benzimidazole ring, a phenanthroline ring, or a quinazoline ring, for example. Optionally, the electron transport layer 25 may contain a metal having an electron transporting property. The electron transport layer 25 that contains the metal having the electron transporting property exhibits an enhanced electron transporting property. Specific but non-limiting examples of the metal in the electron transport layer 25 may include barium (Ba), lithium (Li), calcium (Ca), potassium (K), cesium (Cs), sodium (Na), rubidium (Rb), and ytterbium (Yb).

The electron injection layer 26 may inject, to the electron transport layer 25 and the light-emitting layer 24, electrons injected from the cathode 27. The electron injection layer 26 may include, for example, an electron injecting material that facilitates the injection of electrons from the cathode 27 to the electron transport layer 25 and the light-emitting layer 24. The electron injecting material may include an organic material that has an electron injecting property and is doped with a metal having the electron injecting property, for example. The metal doped in the electron injection layer 26 may be the same as the metal doped in the electron transport layer 25, for example. The electron injection layer 26 may include, for example, a deposited film or a sputtered film.

In an example embodiment of the disclosure, the respective layers in the light-emitting elements 12-2 such as the hole injection layers 22, the hole transport layers 23, the light-emitting layers 24, the electron transport layers 25, and the electron injection layers 26 may be shared between the subpixels 12 that share the grooves 14. In other words, the respective layers in the light-emitting elements 12-2 such as the hole injection layers 22, the hole transport layers 23, the light-emitting layers 24, the electron transport layers 25, and the electron injection layers 26 may extend in the grooves 14 in the column direction beyond the row regulators 13B, for example, as illustrated in FIG. 5. That is, the layers in the light-emitting elements 12-2 may extend on the row regulators 13B.

In another example embodiment of the disclosure, one or more of the layers in the light-emitting element 12-2 such as the hole injection layer 22, the hole transport layer 23, and the light-emitting layer 24 may not be shared between the subpixels 12 in each pixel 11, and may be individually provided for each of the subpixels 12 in each pixel 11. In other words, one or more of the layers in the light-emitting element 12-2 such as the hole injection layer 22, the hole transport layer 23, and the light-emitting layer 24 may be separated by the column regulators 13A, as illustrated in FIG. 4, for example. In still another embodiment of the disclosure, one or more of the layers in the light-emitting element 12-2 such as the electron transport layer 25 and the electron injection layer 26 may be shared between the subpixels 12 in each pixel 11. In other words, one or more of the layers in the light-emitting elements 12-2 such as the electron transport layers 25 and the electron injection layers 26 may extend beyond the column regulators 13A, for example, as illustrated in FIG. 5. That is, one or more of the layers in the light-emitting elements 12-2 may extend on the column regulators 13A.

In another example embodiment of the disclosure, the cathode 27 may extend over the entire light-emitting panel 10. For example, the cathode 27 may extend over the entire display regions 10A. In one example, the cathode 27 may continuously extend over the entire surface including the electron injection layer 26, and the top portions of the column regulators 13A and the row regulators 13B.

In one example illustrated in FIGS. 4 and 5, the light-emitting element 12-2 may further include a sealing layer 28 that protects and seals the light-emitting element 12-2. The sealing layer 28 may include a resin material such as epoxy resin or vinyl resin.

In an example embodiment of the disclosure, each light-emitting element 12-2 may have a microcavity structure. The microcavity structure may have, for example, an effect of strengthening light of a specific wavelength by using light resonance generated between the anode 21 and the cathode 27. Light emitted from the light-emitting layer 24 may be reflected multiple times between the anode 21 and the cathode 27. In this example, a specific wavelength component of the light emitted from the light-emitting layer 24 may be strengthened. The length of the optical path between the anode 21 and the cathode 27 may correspond to the spectral peak wavelength of the light emitted from the light-emitting layer 24. While repeatedly reflecting the light emitted from the light-emitting layer 24 between the anode 21 and the cathode 27 within the range of a predetermined optical length to resonate and strengthen the light of the specific wavelength corresponding to the length of the optical path, the microcavity structure may weaken the light of the wavelength that does not correspond to the length of the optical path. As a result, the spectrum of light L that is extracted may become sharp and intense, increasing luminance and color purity. Accordingly, the distance between the anode 21 and the cathode 27 may be the length of an optical path in which a cavity occurs. With an increase in film thickness, primary interference (i.e., first cavity), secondary interference (i.e., second cavity), and tertiary interference (i.e., third cavity) may occur in the microcavity structure, for example.

[Opposite Panel 40]

Figure 6:
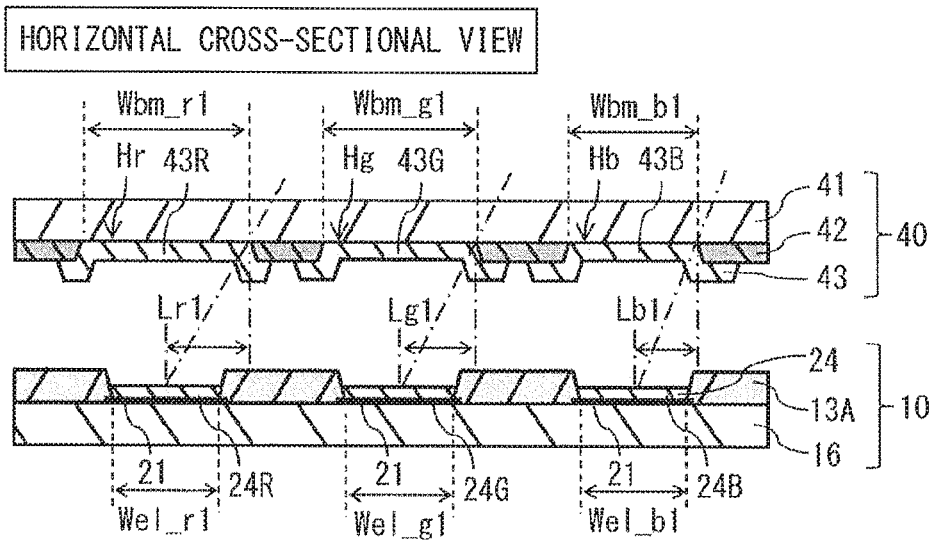
FIG. 6 is a cross-sectional view of an example configuration of the laminated panel taken along the line A-A of the light-emitting panel in FIG. 3.
Figure 7:
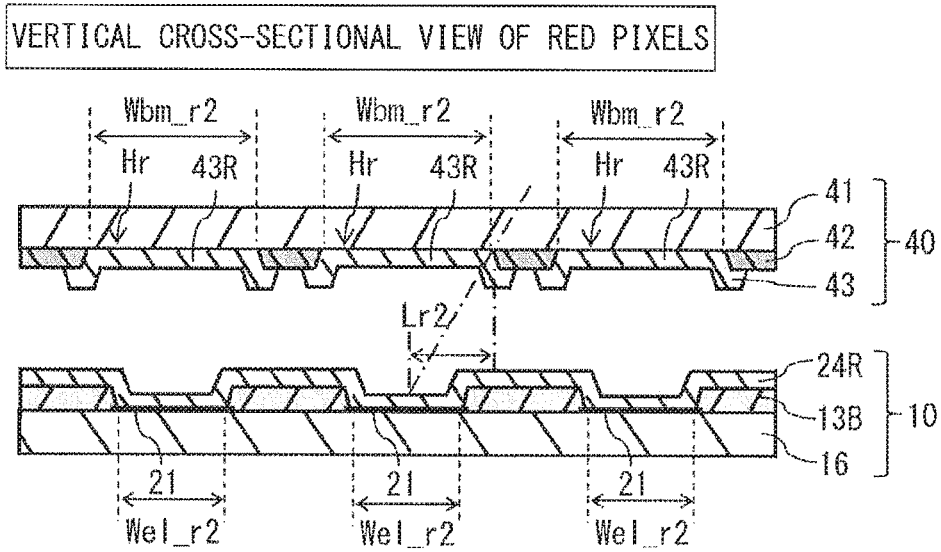
FIG. 7 is a cross-sectional view of an example configuration of the laminated panel taken along the line B-B of the light-emitting panel in FIG. 3.
Figure 8:
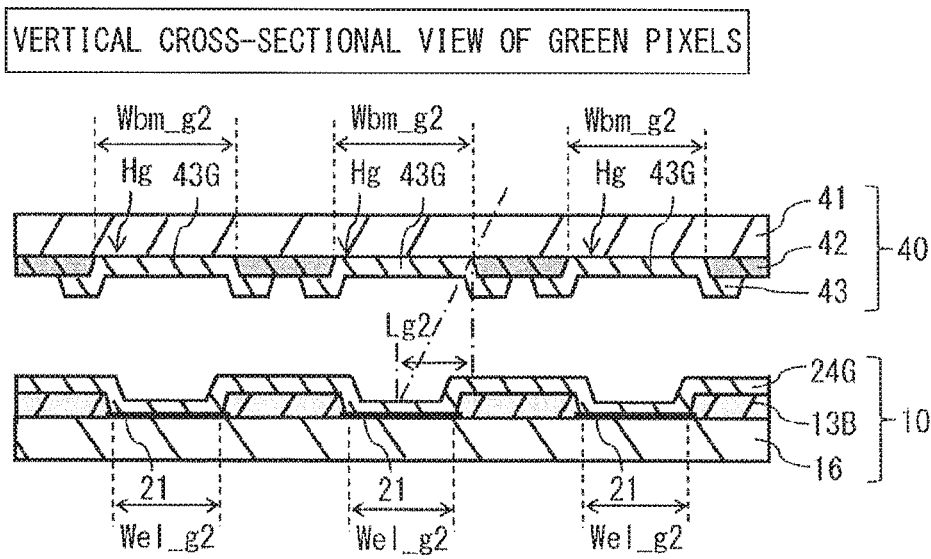
FIG. 8 is a cross-sectional view of an example configuration of the laminated panel taken along the line C-C of the light-emitting panel in FIG. 3.
Figure 9:
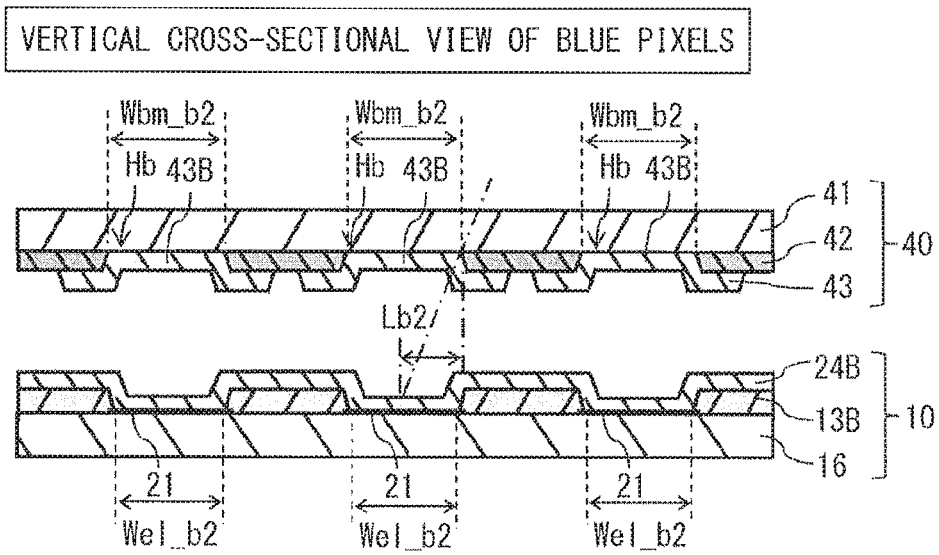
FIG. 9 is a cross-sectional view of an example configuration of the laminated panel taken along the line D-D of the light-emitting panel in FIG. 3.
Figure 10:
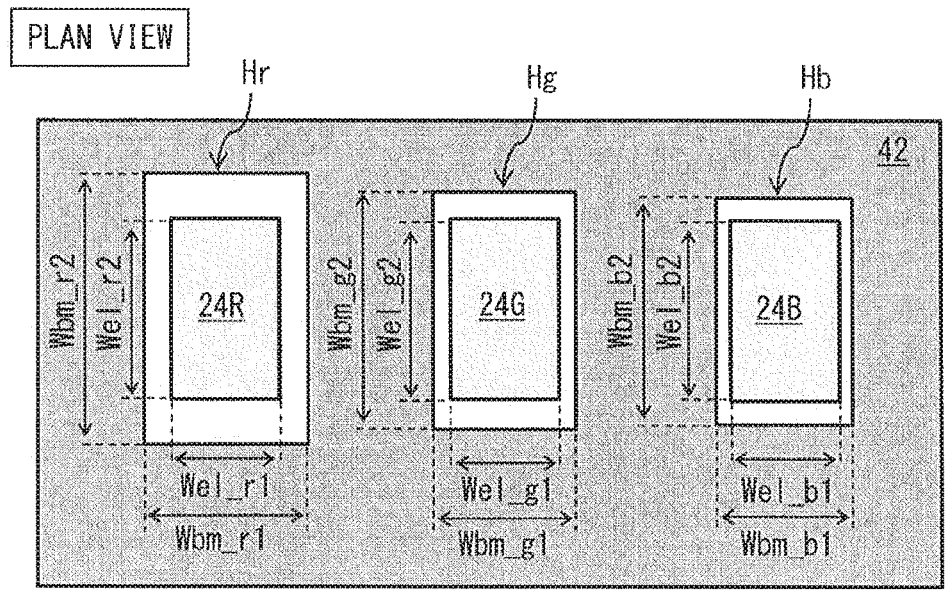
FIG. 10 is a top view of an example configuration of the laminated panel.

The light-emitting device 1 may include the opposite panel 40, as described above. FIG. 6 is a cross-sectional view of an example configuration of the laminated panel taken along the line A-A in FIG. 3. FIG. 7 is a cross-sectional view of an example configuration of the laminated panel taken along the line B-B in FIG. 3. FIG. 8 is a cross-sectional view of an example configuration of the laminated panel taken along the line C-C in FIG. 3. FIG. 9 is a cross-sectional view of an example configuration of the laminated panel taken along the line D-D in FIG. 3. Note that FIGS. 6 to 9 illustrate only main components.

The opposite panel 40 may be opposed to the light-emitting panel 10 at a predetermined interval. The interval between the opposite panel 40 and the light-emitting panel 10 may be filled, for example, with transparent resin such as the sealing layer 28. The opposite panel 40 may include, for example, a supporting substrate 41, a black matrix 42, and a color filter 43. The black matrix 42 may correspond to a specific but non-limiting example of "light-shielding film" according to one embodiment of the disclosure. The black matrix 42 and the color filter 43 may be in contact with the surface of the supporting substrate 41 closer to the light-emitting panel 10. The black matrix 42 may include, for example, a material that absorbs light, or a material that suppresses or prevents reflection. The black matrix 42 may have openings Hr, Hg, and Hb, as described below. The color filters 43 may be provided at least in the openings Hr, Hg, and Hb. The color filters 43 may include a color filter 43R in the opening Hr. The color filter 43R may selectively transmit red light. The color filters 43 may include a color filter 43G in the opening Hg. The color filter 43G may selectively transmit green light. The color filters 43 may include a color filter 43B in the opening Hb. The color filter 43B may selectively transmit blue light.

The black matrix 42 may be adapted to higher resolution. For example, the black matrix 42 may have, at a predetermined interval, the openings Hr, Hg, and Hb at respective positions at which the openings Hr, Hg, and Hb are opposed to the respective light-emitting elements 12-2. The openings Hr, Hg, and Hb may have respective widths that are different from each other. The opening Hr may be provided at a position at which the opening Hr is opposed to the light-emitting element 12r. The opening Hg may be provided at a position at which the opening Hg is opposed to the light-emitting element 12g. The opening Hb may be provided at a position at which the opening Hb is opposed to the light-emitting element 12b.

The openings Hr, Hg, and Hb may be arranged at an equal pitch in the row direction. Additionally, the openings Hr, Hg, and Hb may be arranged at an equal pitch in the column direction. The openings Hr, Hg, and Hb may have a constant pitch in the row direction. The openings Hr, Hg, and Hb may have a constant pitch in the column direction. The pitch of the openings Hr, Hg, and Hb along the row direction may be narrower than that of the openings Hr, Hg, and Hb along the column direction. For example, the pitch of the openings Hr, Hg, and Hb along the row direction may be about a third of the pitch of the openings Hr, Hg, and Hb along the column direction.

Widths Wbm_r1, Wbm_g1, and Wbm_b1 of the openings Hr, Hg, and Hb in the row direction are sized to allow the black matrix 42 to block a portion of the pieces of light emitted from the respective light-emitting elements 12-2 (i.e., light-emitting layers 24) and thereby to cause the 45-degree luminance viewing angle (cd/m$^2$) to be different in the row direction. Additionally, the widths Wbm_r1, Wbm_g1, and Wbm_b1 may be sized to cause color differences ($\Delta$u'v') at a 45-degree chromaticity viewing angle (u'v') in the row direction to be 0.020 or less. Similarly, widths Wbm_r2, Wbm_g2, and Wbm_b2 of the openings Hr, Hg, and Hb in the column direction are sized to allow the black matrix 42 to block a portion of the pieces of light emitted from the respective light-emitting elements 12-2 (i.e., light-emitting layers 24) and thereby to cause the 45-degree luminance viewing angle (cd/m$^2$) to be different in the column direction. Additionally, the widths Wbm_r2, Wbm_g2, and Wbm_b2 may be sized to cause the color differences ($\Delta$u'v') at the 45-degree chromaticity viewing angle (u'v') in the column direction to be 0.020 or less, 0.010 or less, or 0.004 or less.

The luminance viewing angle (cd/m²) may be measured with the use of a luminance meter. The chromaticity viewing angle (u'v') may be measured with the use of a spectroradiometer. The specifications of current general-purpose displays for the color difference (Δu'v') generally show 0.020. The specifications of current high-grade monitors for the color difference (Δu'v') generally show 0.010. A color difference (Δu'v') of 0.004 corresponds to the limit of human recognition.

The openings Hr, Hg, and Hb may be different in size. The width Wbm_r1 of the opening Hr in the row direction may be greater than the width Wbm_g1 of the opening Hg in the row direction. The width Wbm_g1 of the opening Hg in the row direction may be greater than the width Wbm_b1 of the opening Hb in the row direction. The width Wbm_r2 of the opening Hr in the column direction may be greater than the width Wbm_g2 of the opening Hg in the column direction. Additionally, the width Wbm_g2 of the opening Hg in the column direction may be greater than the width Wbm_b2 of the opening Hb in the column direction.

The width Wbm_r1 of the opening Hr in the row direction may be greater than the width Wel_r1 of the light-emitting element 12r in the row direction. The width Wbm_g1 of the opening Hg in the row direction may be greater than the width Wel_g1 of the light-emitting element 12g in the row direction. The width Wbm_b1 of the opening Hb in the row direction may be greater than the width Wel_b1 of the light-emitting element 12b in the row direction. The width Wbm_r2 of the opening Hr in the column direction may be greater than the width Wel_r2 of the light-emitting element 12r in the column direction. The width Wbm_g2 of the opening Hg in the column direction may be greater than the width Wel_g2 of the light-emitting element 12g in the column direction. The width Wbm_b2 of the opening Hb in the column direction may be greater than the width Wel_b2 of the light-emitting element 12b in the column direction.

The difference between the width Wbm_r1 of the opening Hr in the row direction and the width Wel_r1 of the light-emitting element 12r in the row direction may be greater than the difference between the width Wbm_g1 of the opening Hg in the row direction and the width Wel_g1 of the light-emitting element 12g in the row direction. The difference between the width Wbm_r2 of the opening Hr in the column direction and the width Wel_r2 of the light-emitting element 12r in the column direction may be greater than the difference between the width Wbm_g2 of the opening Hg in the column direction and the width Wel_g2 of the light-emitting element 12g in the column direction.

The difference between the width Wbm_g1 of the opening Hg in the row direction and the width Wel_g1 of the light-emitting element 12g in the row direction may be greater than the difference between the width Wbm_b1 of the opening Hb in the row direction and the width Wel_b1 of the light-emitting element 12b in the row direction. The difference between the width Wbm_g2 of the opening Hg in the column direction and the width Wel_g2 of the light-emitting element 12g in the column direction may be greater than the difference between the width Wbm_b2 of the opening Hb in the column direction and the width Wel_b2 of the light-emitting element 12b in the column direction.

The width Wbm_r1 of the opening Hr in the row direction may be approximately sized to cause the black matrix 42 to block a portion of the row direction component of light emitted from the light-emitting element 12r. The width Wbm_r2 of the opening Hr in the column direction may be approximately sized to cause the black matrix 42 to block a portion of the column direction component of light emitted from the light-emitting element 12r. Alternatively, the width Wbm_r2 of the opening Hr in the column direction may be approximately sized to prevent the black matrix 42 from blocking a portion of the column direction component of light emitted from the light-emitting element 12r. Determining whether the 45-degree luminance viewing angle (cd/m²) of light emitted from the subpixel 12R is different between the row direction and the column direction may make it possible to determine whether the black matrix 42 blocks a portion of light emitted from the light-emitting element 12r. In one example where the 45-degree luminance viewing angle (cd/m²) of light emitted from the subpixel 12R is different between the row direction and the column direction, it is determined that the black matrix 42 blocks a portion of light emitted from the light-emitting element 12r.

The width Wbm_g1 of the opening Hg in the row direction may be approximately sized to cause the black matrix 42 to block a portion of the row direction component of light emitted from the light-emitting element 12g. The width Wbm_g2 of the opening Hg in the column direction may be approximately sized to cause the black matrix 42 to block a portion of the column direction component of light emitted from the light-emitting element 12g. Alternatively, the width Wbm_g2 of the opening Hg in the column direction may be approximately sized to prevent the black matrix 42 from blocking a portion of the column direction component of light emitted from the light-emitting element 12g. Determining whether the 45-degree luminance viewing angle (cd/m²) of light emitted from the subpixel 12G is different between the row direction and the column direction may make it possible to determine whether the black matrix 42 blocks a portion of light emitted from the light-emitting element 12g. In one example where the 45-degree luminance viewing angle (cd/m²) of light emitted from the subpixel 12G is different between the row direction and the column direction, it is determined that the black matrix 42 blocks a portion of light emitted from the light-emitting element 12g.

The width Wbm_b1 of the opening Hb in the row direction may be approximately sized to cause the black matrix 42 to block a portion of the row direction component of light emitted from the light-emitting element 12b. The width Wbm_b2 of the opening Hb in the column direction may be approximately sized to cause the black matrix 42 to block a portion of the column direction component of light emitted from the light-emitting element 12b. Alternatively, the width Wbm_b2 of the opening Hb in the column direction may be approximately sized to prevent the black matrix 42 from blocking a portion of the column direction component of light emitted from the light-emitting element 12b. Determining whether the 45-degree luminance viewing angle (cd/m²) of light emitted from the subpixel 12B is different between the row direction and the column direction may make it possible to determine whether the black matrix 42 blocks a portion of the row direction component and the column direction component of light emitted from the light-emitting element 12b. In one example where the 45-degree luminance viewing angle (cd/m²) of light emitted from the subpixel 12B is different between the row direction and the column direction, it is determined that the black matrix 42 blocks a portion of light emitted from the light-emitting element 12b.

The widths Wbm_r1, Wbm_g1, Wbm_b1, Wbm_r2, Wbm_g2, and Wbm_b2 of the openings Hr, Hg, and Hb in the row direction and the column direction may be sized to cause the luminance differences ΔL at the 45-degree luminance viewing angle (cd/m²) to exceed 3% in any of the colors of the respective pieces of light that are emitted. The luminance differences ΔL may be each obtained from the following Expression 1:

$$\Delta L = ((L\ max - L\ min)/L\ max) \times 100 \qquad \text{Expression 1}$$

where L max denotes the larger one of the 45-degree luminance viewing angle (cd/m$^2$) in the row direction and the 45-degree luminance viewing angle (cd/m$^2$) in the column direction, and L min denotes the smaller one of the 45-degree luminance viewing angle (cd/m$^2$) in the row direction and the 45-degree luminance viewing angle (cd/m$^2$) in the column direction. Note that too much vignetting (light shielding) caused by the black matrix 42 may sometimes make it more difficult to adjust a shift of the chromaticity viewing angle (u'v') between the horizontal direction and the vertical direction. In view of this, for example, the widths Wbm_r1, Wbm_g1, Wbm_b1, Wbm_r2, Wbm_g2, and Wbm_b2 of the openings Hr, Hg, and Hb in the row direction and the column direction may be sized to cause the luminance differences ΔL to fall below 30% in any of the colors of the respective pieces of light that are emitted.

Figure 11:
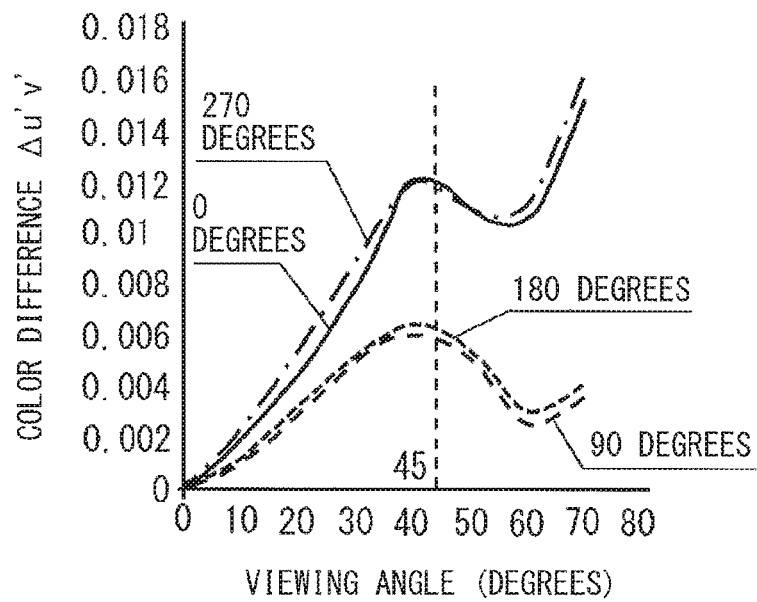
FIG. 11 illustrates an example relation between a viewing angle and a color difference of a laminated panel according to a comparative example.
Figures 12, 13:
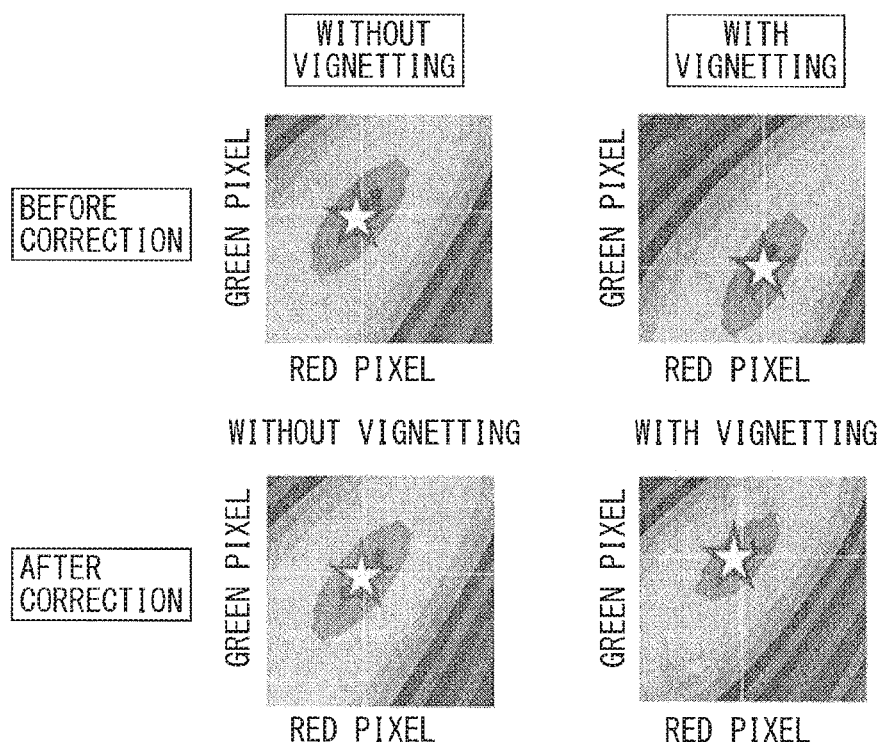
FIG. 12 illustrates an example luminance viewing angle on the laminated panel according to a comparative example.
FIG. 13 illustrates an example contour map of a 45-degree chromaticity viewing angle on the laminated panel according to a comparative example.

FIG. 11 illustrates an example relation between a viewing angle and a color difference of a laminated panel according to a comparative example. FIG. 12 illustrates an example luminance viewing angle (cd/m$^2$) on the laminated panel according to a comparative example.

In the laminated panel according to a comparative example, the widths of light-emitting elements are all equal in the row direction. The widths of light-emitting elements are all equal in the column direction. The widths of the openings of a black matrix are all equal in the row direction. The widths of the openings of a black matrix are all equal in the column direction. For the laminated panel according to a comparative example, an organic EL element having a resonating structure is formed as a light-emitting element of each subpixel through a printing process. The printing process causes a large film-thickness distribution in the row direction. In this example, a light emission distribution is relatively wide in a red subpixel, and becomes narrower in order of a green subpixel and a blue subpixel. Accordingly, a blue subpixel emits little light on an outer edge of an opening of a black matrix.

In one example where each subpixel of the laminated panel according to a comparative example has a constant difference between the width of an opening of a black matrix and the width of a light-emitting element, each subpixel has a constant distance (i.e., difference Ls) between the center of the light-emitting element and the projection point on the light-emitting panel where an end portion of the opening of the black matrix is projected. In this example, a red subpixel, a green subpixel, and a blue subpixel have different proportions of vignetting (light shielding) caused by a black matrix. Accordingly, displaying a white color causes a color shift. Additionally, a subpixel has an aspect ratio of about 1:3, and thus each subpixel has a different proportion of vignetting (light shielding) by a black matrix between the row direction and the column direction. Accordingly, the degree of a color shift is different depending on the direction in which the laminated panel is visually recognized. In a specific example illustrated in FIG. 11, the color difference Δu'v' considerably differs between the vertical direction (visual recognition direction: 0 degrees and 270 degrees) and the horizontal direction (visual recognition direction: 90 degrees and 180 degrees). The color difference Δu'v' at 45 degrees in the vertical direction (visual recognition direction: 0 degrees and 270 degrees) exceeds 0.012. In contrast, the color difference Δu'v' at 45 degrees in the horizontal direction (visual recognition direction: 90 degrees and 180 degrees) is slightly greater than the limit (0.004) of human recognition.

FIG. 12 illustrates that a luminance viewing angle characteristic with respect to the vertical direction (visual recognition direction: 0 degrees and 270 degrees) is a luminance viewing angle characteristic substantially specific to a resonator because little vignetting occurs. The luminance viewing angle characteristic with respect to the vertical direction shows about 65% to 66% at the 45-degree luminance viewing angle (cd/m$^2$). In contrast, as a luminance viewing angle characteristic with respect to the horizontal direction (visual recognition direction: 90 degrees and 180 degrees), vignetting grows larger in order of blue subpixels, green subpixels, and red subpixels, resulting in about 68% for blue and green subpixels, and about 70% for red subpixels at the 45-degree luminance viewing angle (cd/m$^2$).

A red subpixel has a difference (luminance difference ΔL) of 7.1% between a luminance viewing angle characteristic with respect to a maximum direction and a luminance viewing angle characteristic with respect to a minimum direction. A green subpixel has a difference (luminance difference ΔL) of 4.4% between a luminance viewing angle characteristic with respect to the maximum direction and a luminance viewing angle characteristic with respect to the minimum direction. A blue subpixel has a difference (luminance difference ΔL) of 2.9% between a luminance viewing angle characteristic with respect to the maximum direction and a luminance viewing angle characteristic with respect to the minimum direction. Accordingly, the luminance viewing angle characteristics of red and green subpixels considerably differ depending on the direction in which the laminated panel is visually recognized, as compared with that of a blue subpixel.

In this way, the luminance viewing angle characteristic and the color difference Δu'v' of the laminated panel according to a comparative example considerably differ depending on the direction in which the laminated panel is visually recognized. These show that, as illustrated in the 45-degree chromaticity viewing angle contour map on the upper portion of FIG. 13, the optimum value of the chromaticity viewing angle (u'v') is shifted by vignetting depending on a viewing direction. In the 45-degree chromaticity viewing angle contour map in FIG. 13, a horizontal axis represents the film thickness of a coated film in a red subpixel, and a vertical axis represents the film thickness of a coated film in a green subpixel. The wording "BEFORE CORRECTION" in FIG. 13 means that the widths of openings of a black matrix are all equal in the row direction, and the widths of openings of a black matrix are all equal in the column direction. The wording "AFTER CORRECTION" in FIG. 13 means that the widths of openings of a black matrix are adjusted. Incidentally, it is also possible to set an intermediate value of the optimum values in the respective directions as the film thickness of a light-emitting element. However, in this example, a margin of film thickness control decreases and a problem can arise that a yield decreases, for example.

In an example embodiment of the disclosure, the relation between the widths Wbm_r1, Wbm_g1, Wbm_b1, Wbm_r2, Wbm_g2, and Wbm_b2 of the openings Hr, Hg, and Hb of the black matrix 42 and the widths Wel_r1, Wel_g1, Wel_b1, Wel_r2, Wel_g2, and Wel_b2 of the light-emitting elements 12-2 may be set depending on the degree of influence of vignetting on the maximum value and the minimum value of the luminance viewing angle (cd/m$^2$) of a single color. In one example where vignetting has considerable influence, a great difference may be set as the difference between the widths of the openings Hr, Hg, and Hb of the black matrix 42 and the widths of the respective light-emitting elements 12-2 to make it more difficult for vignetting to occur. In another example where vignetting has a little influence, a small difference may be set as the difference between the widths of the openings Hr, Hg, and Hb of the black matrix 42 and the widths of the respective light-emitting elements 12-2 to make it easier for vignetting to occur. This may allow the balance between colors to be controlled and decrease a color change caused by a viewing angle. Matching the optimum points of the chromaticity viewing angle (u'v') in orientations improves image grade and productivity.

For example, each of the light-emitting elements 12-2 may have a constant width, and the difference between the width Wbm_r1 of the opening Hr in the row direction and the width Wel_r1 of the light-emitting element 12r in the row direction may be greater than the difference between the width Wbm_g1 of the opening Hg in the row direction and the width Wel_g1 of the light-emitting element 12g in the row direction. For example, each of the light-emitting elements 12-2 may have a constant width, and the difference between the width Wbm_r2 of the opening Hr in the column direction and the width Wel_r2 of the light-emitting element 12r in the column direction may be greater than the difference between the width Wbm_g2 of the opening Hg in the column direction and the width Wel_g2 of the light-emitting element 12g in the column direction. For example, each of the light-emitting elements 12-2 may further have a constant width, and the difference between the width Wbm_g1 of the opening Hg in the row direction and the width Wel_g1 of the light-emitting element 12g in the row direction may be greater than the difference between the width Wbm_b1 of the opening Hb in the row direction and the width Wel_b1 of the light-emitting element 12b in the row direction. For example, each of the light-emitting elements 12-2 may have a constant width, and the difference between the width Wbm_g2 of the opening Hg in the column direction and the width Wel_g2 of the light-emitting element 12g in the column direction may be greater than the difference between the width Wbm_b2 of the opening Hb in the column direction and the width Wel_b2 of the light-emitting element 12b in the column direction.

Figure 14:
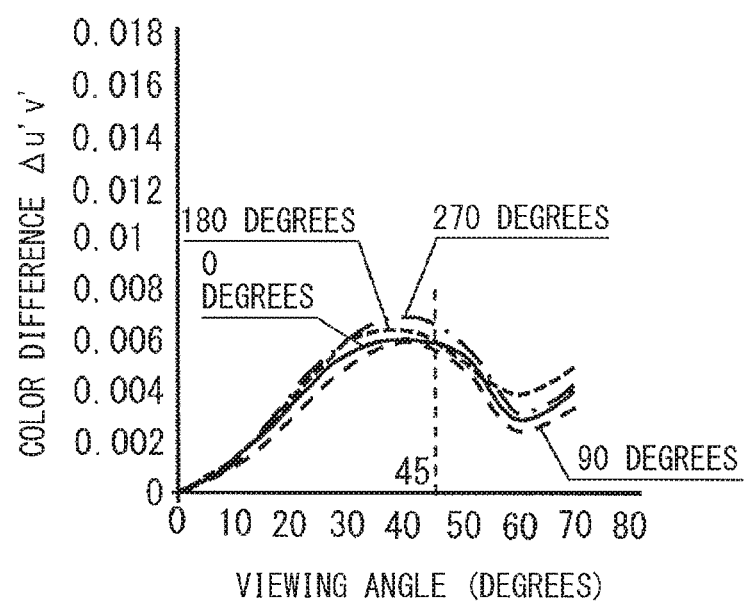
FIG. 14 illustrates an example relation between a viewing angle and a color difference of a laminated panel according to an inventive example.

For example, the light-emitting elements 12-2 may each have a width of 30 µm in the row direction. The light-emitting elements 12-2 may each have a width of 90 µm in the column direction. Additionally, the opening Hr of the black matrix 42 may have a width of 39 µm in the row direction. The opening Hg of the black matrix 42 may have a width of 37 µm in the row direction. The opening Hb of the black matrix 42 may have a width of 35.5 µm in the row direction. The openings Hr, Hg, and Hb of the black matrix 42 may each have a width of 90 µm in the column direction. FIG. 14 illustrates the relation between a viewing angle and a color difference in this example. As can be seen from FIG. 14, the color difference Δu'v' is substantially equal between the vertical direction (visual recognition direction: 0 degrees and 270 degrees) and the horizontal direction (visual recognition direction: 90 degrees and 180 degrees). As illustrated in the lower portion of FIG. 13, this may be caused by adjusting the width of an opening of the black matrix 42, and bringing the optimum center of the 45-degree chromaticity viewing angle (u'v') to the same position in the presence and absence of vignetting. Note that a method for adjusting the width of an opening of the black matrix 42 may not be limited to the method described above.

Figure 15:
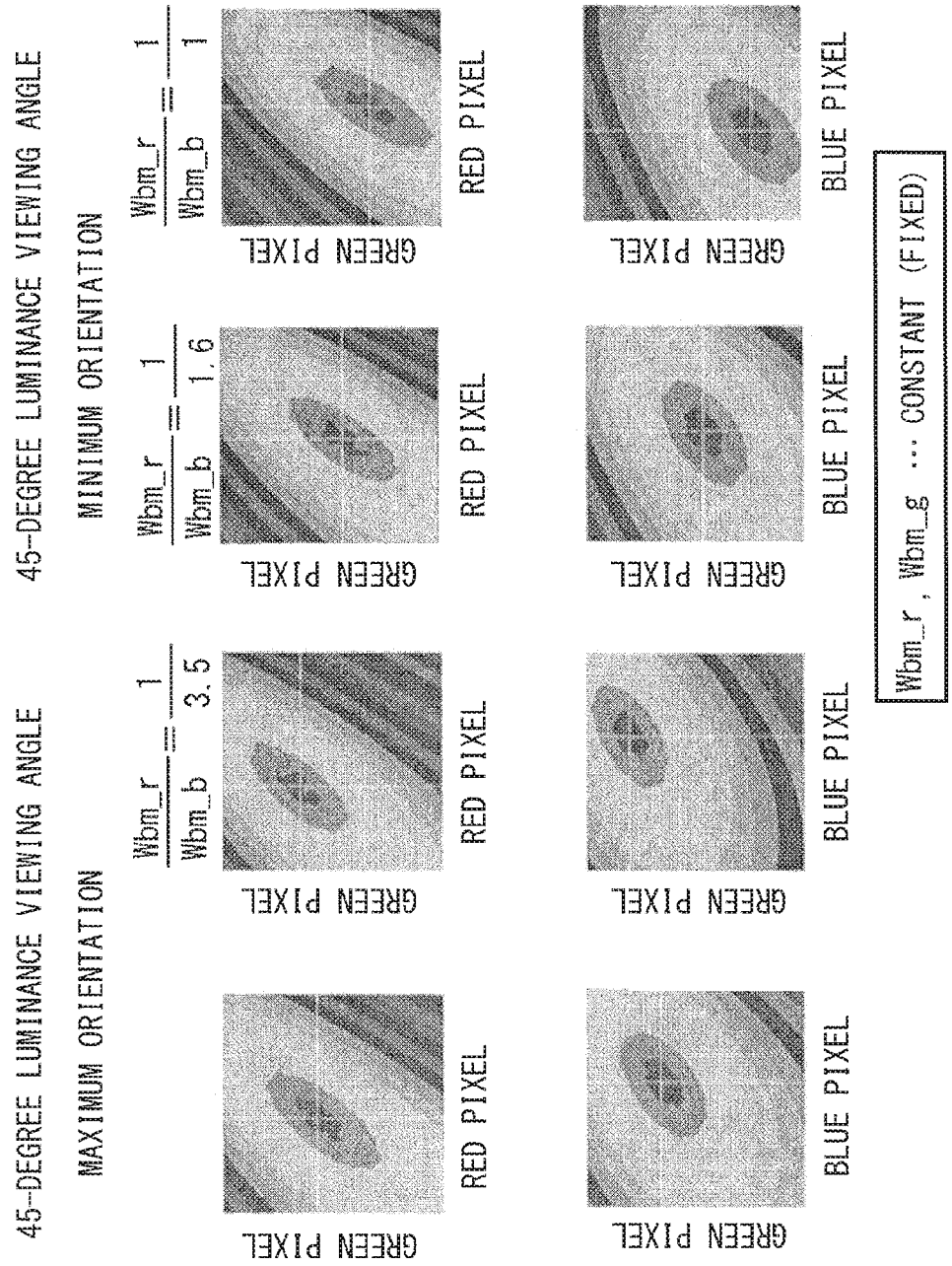
FIG. 15 illustrates an example contour map of a 45-degree chromaticity viewing angle on the laminated panel according to an inventive example.

FIG. 15 illustrates a variety of 45-degree chromaticity viewing angle contour maps. The upper and lower left portions of FIG. 15 each illustrate a 45-degree chromaticity viewing angle contour map of a 45-degree luminance viewing angle maximum orientation. The remaining portions of FIG. 15 each illustrate a 45-degree chromaticity viewing angle contour map of a 45-degree luminance viewing angle minimum orientation with three types of aspect ratios set for openings of the black matrix 42. As can be seen from FIG. 15, the position of the optimum center of the 45-degree chromaticity viewing angle (u'v') considerably shifts depending on the aspect ratio of an opening of the black matrix 42.

[Example Effects]

Described below are some example effects of the light-emitting device 1 according to an example embodiment of the disclosure.

Display devices including self-luminous elements such as organic EL elements may sometimes adopt color filters using black matrices to secure a wide color reproduction range, and suppress or prevent reflection of external light. In one example where light-emitting sections and black matrices of the display device are installed at a constant interval, viewing the display device from an oblique direction may sometimes offer vignetting caused by a black matrix. This phenomenon may be more prominent with an increase in the resolution of the display device.

Organic EL elements may be different in lifetime, depending on the colors of the respective pieces of light that are emitted. Elements that are shorter in lifetime may thus have larger pixel openings in many cases. Organic EL elements manufactured in a printing method may have a film-thickness distribution. The film thickness of a region around a pixel may be considerably different from that of the center. Additionally, in one example where a resonating structure is used for an organic EL element, a light-emitting section may have a strong in-plane distribution. Accordingly, vignetting as viewed from an oblique direction may be different for each color irrespective of the same light-emitting area, resulting in a color shift.

As countermeasures, for example, Japanese Patent No. 4715906 teaches making widths in the horizontal direction equal to each other. Japanese Patent No. 5293497 teaches reducing a color shift by changing the distance between a black matrix and a light-emitting section for each color. However, in one example where light-emitting sections of RGB have different aspect ratios, the amount of vignetting may be different for each direction. Accordingly, a color shift may be different for each direction, reducing image grade. In one example where an adjustment is made with the use of the film thickness of the inside of a resonator, the productivity may sometimes decrease considerably.

In contrast, in an example embodiment of the disclosure, the widths Wbm_r1, Wbm_g1, Wbm_b1, Wbm_r2, Wbm_g2, and Wbm_b2 of the openings Hr, Hg, and Hb of the black matrix 42 in the row direction and the column direction are sized to allow the black matrix 42 to block a portion of the pieces of light emitted from the respective light-emitting elements 12-2 and thereby to cause the 45-degree luminance viewing angle (cd/m$^2$) to be different between the row direction and the column direction. Additionally, the widths Wbm_r1, Wbm_g1, Wbm_b1, Wbm_r2, Wbm_g2, and Wbm_b2 of the openings Hr, Hg, and Hb in the row direction and the column direction are sized to cause the color differences (Δu'v') at the 45-degree chromaticity viewing angle (u'v') in the row direction and the column direction to be 0.020 or less. This allows a color shift to be reduced even if the black matrix 42 causes vignetting (light shielding) in a case where each of the openings Hr, Hg, and Hb of the black matrix 42 is reduced in size. Accordingly, this suppresses or prevents a decrease in image grade at high resolution.

In an example embodiment of the disclosure, the widths Wbm_r1, Wbm_g1, Wbm_b1, Wbm_r2, Wbm_g2, and Wbm_b2 of the openings Hr, Hg, and Hb of the black matrix 42 in the row direction and the column direction may be sized to cause the color differences (Δu'v') to be 0.004 or less. This may cause the color differences (Δu'v') to have a value corresponding to the limit of human recognition or a lower value. Accordingly, a viewer may be unable to recognize a color shift in the first place. Accordingly, this suppresses or prevents a decrease in image grade at high resolution.

In an example embodiment of the disclosure, even if the widths Wbm_r1, Wbm_g1, Wbm_b1, Wbm_r2, Wbm_g2, and Wbm_b2 of the openings Hr, Hg, and Hb in the row direction and the column direction are sized to cause the luminance differences ΔL obtained from Expression 1 at the 45-degree luminance viewing angle (cd/m$^2$) to exceed 3% in any of the colors of the respective pieces of light that are emitted, the relation between the widths Wbm_r1, Wbm_g1, Wbm_b1, Wbm_r2, Wbm_g2, and Wbm_b2 of the openings Hr, Hg, and Hb of the black matrix 42 and the widths Wel_r1, Wel_g1, Wel_b1, Wel_r2, Wel_g2, and Wel_b2 of the light-emitting elements 12-2 may be set depending on the degree of influence of vignetting on the maximum value and the minimum value of the luminance viewing angle (cd/m$^2$) of a single color. This may make it possible to control the balance between colors, decrease a color change caused by a viewing angle, and match the optimum points of the chromaticity viewing angle (u'v') in orientations. This improves image grade and productivity.

In an example embodiment of the disclosure, each of the light-emitting elements 12-2 may have the light-emitting layer 24 including a coated film. The widths Wel_r1, Wel_g1, Wel_b1, Wel_r2, Wel_g2, and Wel_b2 of the light-emitting elements 12-2 may be defined by the insulating layers 13. Therefore, influence of wettability from the insulating layer 13 may make the film-thickness distribution of the light-emitting layer 24 ununiform. Accordingly, the influence of a microcavity described above may hinder the extraction of the light of the portion where the film thickness of the light-emitting layer 24 does not satisfy a resonance condition. The light-emitting regions 24A in the subpixels 12R, 12G, and 12B may be different in size from each other. As a result, making the widths Wel_r1, Wel_g1, and Wel_b1 of the light-emitting elements 12-2 in the row direction equal to each other, and making the widths Wbm_r1, Wbm_g1, Wbm_b1, Wbm_r2, Wbm_g2, and Wbm_b2 of the openings Hr, Hg, and Hb of the black matrix 42 equal to each other may cause a shift of the chromaticity viewing angle (u'v') in a visual recognition direction. In contrast, in an example embodiment of the disclosure, the relation of the widths Wbm_r1, Wbm_g1, Wbm_b1, Wbm_r2, Wbm_g2, and Wbm_b2 of the openings Hr, Hg, and Hb of the black matrix 42 with the widths Wel_r1, Wel_g1, Wel_b1, Wel_r2, Wel_g2, and Wel_b2 of the light-emitting elements 12-2 may be set depending on the degree of influence of vignetting on the maximum value and the minimum value of the luminance viewing angle (cd/m$^2$) of a single color. This may make it possible to control the balance between colors, decrease a color change caused by a viewing angle, and match the optimum values of the chromaticity viewing angle (u'v') in orientations. Accordingly, even if the light-emitting elements 12-2 each have the light-emitting layer 24 including a coated film, image grade and productivity are improved.

In an example embodiment of the disclosure, the openings Hr, Hg, and Hb of the black matrix 42 may have a regular pitch along the row direction. The openings Hr, Hg, and Hb of the black matrix 42 may have a regular pitch along the column direction. Owing to this, the light-emitting device 1 according to an example embodiment of the disclosure may not be limited to particular use, but may be applicable to a general-purpose display and a high-grade monitor, for example.

In an example embodiment of the disclosure where the column regulators 13A define the light-emitting elements 12-2 in the row direction, the influence of wettability from the column regulators 13A may make the film-thickness distribution of the light-emitting layer 24 in the row direction more ununiform than the film-thickness distribution of the light-emitting layer 24 in the column direction. Accordingly, the influence of a microcavity described above may hinder the extraction of the light of the portion where the film thickness of the light-emitting layer 24 does not satisfy a resonance condition. The light-emitting regions 24A in the subpixels 12R, 12G, and 12B may be different in size from each other. As a result, making the widths Wel_r1, Wel_g1, and Wel_b1 of the light-emitting elements 12-2 in the row direction equal to each other, and making the widths Wbm_r1, Wbm_g1, Wbm_b1, Wbm_r2, Wbm_g2, and Wbm_b2 of the openings Hr, Hg, and Hb of the black matrix 42 equal to each other may cause a shift of the chromaticity viewing angle (u'v') in a visual recognition direction. In contrast, in an example embodiment of the disclosure, the relation of the widths Wbm_r1, Wbm_g1, Wbm_b1, Wbm_r2, Wbm_g2, and Wbm_b2 of the openings Hr, Hg, and Hb of the black matrix 42 with the widths Wel_r1, Wel_g1, Wel_b1, Wel_r2, Wel_g2, and Wel_b2 of the light-emitting elements 12-2 may be set depending on the degree of influence of vignetting on the maximum value and the minimum value of the luminance viewing angle (cd/m$^2$) of a single color. This may make it possible to control the balance between colors, decrease a color change caused by a viewing angle, and match the optimum values of the chromaticity viewing angle (u'v') in orientations. Accordingly, even if the column regulators 13A define the light-emitting elements 12-2 in the row direction, image grade and productivity are improved.

In an example embodiment of the disclosure, the resolution of the pixels 11 may be 100 ppi or more, 120 ppi or more, or 150 ppi or more. Thus, the relation of the widths Wbm_r1, Wbm_g1, Wbm_b1, Wbm_r2, Wbm_g2, and Wbm_b2 of the openings Hr, Hg, and Hb of the black matrix 42 with the widths Wel_r1, Wel_g1, Wel_b1, Wel_r2, Wel_g2, and Wel_b2 of the light-emitting elements 12-2 may be set depending on the degree of influence of vignetting on the maximum value and the minimum value of the luminance viewing angle (cd/m$^2$) of a single color in the situation in which it is difficult in the first place to eliminate vignetting (light shielding) in the black matrix 42. Such a situation may not occur at low definition. This may make it possible to control the balance between colors, decrease a color change caused by a viewing angle, and match the optimum values of the chromaticity viewing angle (u'v') in orientations. Accordingly, even if the resolution of the pixels 11 is 100 ppi or more, 120 ppi or more, or 150 ppi or more, image grade and productivity are improved.

[2. Application Examples]

Application Example 1

Described below is an application example of the light-emitting device 1 according to any foregoing example embodiment of the disclosure. The light-emitting device 1 according to any foregoing example embodiment of the disclosure is applicable to a variety of display devices of electronic apparatuses that display images or pictures based on external or internal image signals. Specific but non-limiting examples of the electronic apparatuses may include television apparatuses, digital cameras, notebook personal computers, sheet-like personal computers, portable terminal devices such as mobile phones, and video cameras.

Figure 16:
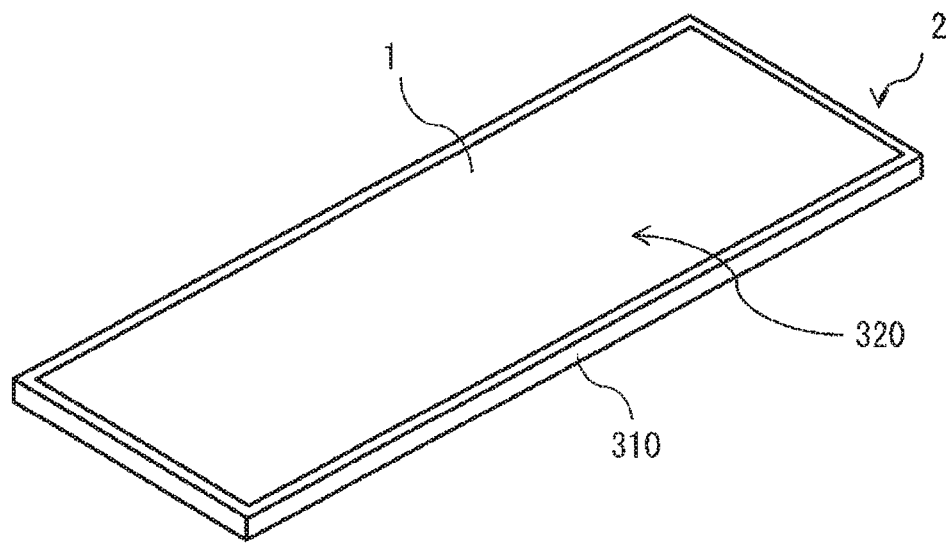
FIG. 16 is a perspective view of an example appearance of an electronic apparatus provided with a light-emitting device according to one example embodiment of the disclosure.

FIG. 16 is a perspective view of an electronic apparatus 2 having an example appearance according to Application Example 1. The electronic apparatus 2 may be, for example, a sheet-like personal computer that includes a body 310 having a display surface 320 on a main face. The light-emitting device 1 according to any foregoing example embodiment of the disclosure may be provided on the display surface 320 of the electronic apparatus 2 as a display device. The light-emitting device 1 according to any foregoing example embodiment of the disclosure may be disposed to have the opposite panel 40 face outside. In Application Example 1, the light-emitting device 1 according to any foregoing example embodiment of the disclosure may be provided on the display surface 320, offering the electronic apparatus 2 that is high in visual recognizability and display quality.

Application Example 2

Described below is another application example of the light-emitting device 1 according to any foregoing example embodiment of the disclosure. The light-emitting device 1 according to any foregoing example embodiment of the disclosure is applicable to a variety of light sources in illumination apparatuses for table lightings, or floor lightings, and room lightings.

Figure 17:
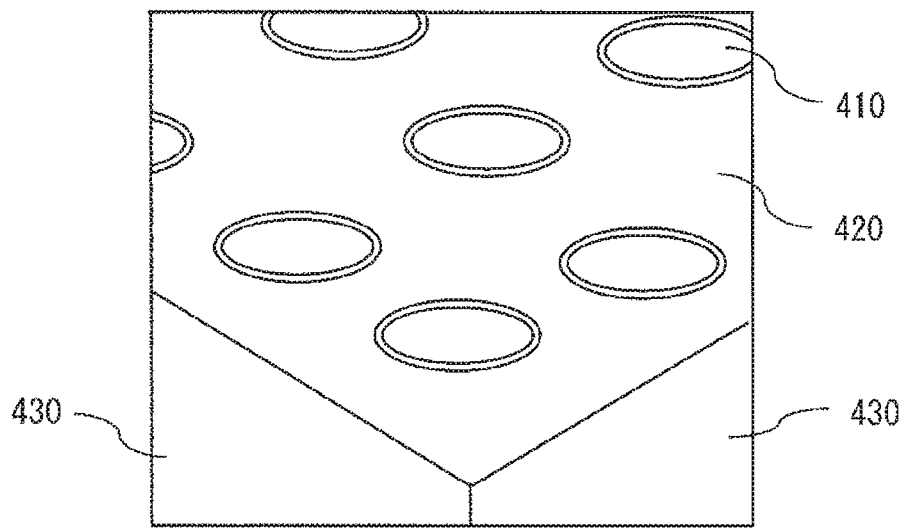
FIG. 17 is a perspective view of an example appearance of an illumination apparatus provided with the light-emitting element according to one example embodiment of the disclosure.

FIG. 17 illustrates an example appearance of an illumination apparatus for a room lighting that is provided with the light-emitting device 1 according to any foregoing example embodiment of the disclosure. The illumination apparatus may include, for example, illuminating sections 410 each including the light-emitting device 1 according to any foregoing example embodiment of the disclosure. An appropriate number of the illuminating sections 410 may be disposed at appropriate intervals on a ceiling 420 of a building. Note that the illuminating sections 410 may be installed on any place, such as a wall 430 or a non-illustrated floor, other than the ceiling 420, depending on the intended use.

The illumination apparatus may perform illumination with light emitted from the light-emitting device 1 according to any foregoing example embodiment of the disclosure. This offers an illumination apparatus that is high in illumination quality.

Although the disclosure is described hereinabove with reference to the example embodiments and modification examples, these embodiments and modification examples are not to be construed as limiting the scope of the disclosure and may be modified in a wide variety of ways. It should be appreciated that the effects described herein are mere examples. Effects of an example embodiment and modification examples of the disclosure are not limited to those described herein. The disclosure may further include any effects other than those described herein.

It is possible to achieve at least the following configurations from the above-described example embodiments of the disclosure.

(1) A light-emitting device including
a plurality of pixels each including a plurality of subpixels,
each of the subpixels including
a plurality of light-emitting elements that emits respective pieces of light of colors different from each other, and
a light-shielding film having a plurality of openings, the openings being provided at respective positions at which the openings are opposed to the respective light-emitting elements at a predetermined interval, the openings having respective widths that are different from each other,
the widths of the respective openings in a first direction and a second direction being sized to allow the light-shielding film to block a portion of the pieces of light emitted from the respective light-emitting elements and thereby to cause a 45-degree luminance viewing angle in the first direction and a 45-degree luminance viewing angle in the second direction to be different, the 45-degree luminance viewing angle being expressed in a unit of $cd/m^2$,
the widths of the respective openings in the first direction and the second direction being sized to cause color differences ($\Delta u'v'$) at a 45-degree chromaticity viewing angle (u'v') in the first direction and the second direction to be 0.020 or less.

(2) The light-emitting device according to (1), in which the widths of the respective openings in the first direction and the second direction are sized to cause the color differences to be 0.004 or less.

(3) The light-emitting device according to (1) or (2), in which the widths of the respective openings in the first direction and the second direction are sized to cause a luminance difference $\Delta L$ at the 45-degree luminance viewing angle to exceed 3% in any of the colors of the respective pieces of light that are emitted,
the luminance difference $\Delta L$ being obtained from the following expression:

$$\Delta L = ((L\max - L\min)/L\max) \times 100$$

where L max denotes larger one of the 45-degree luminance viewing angle in the first direction and the 45-degree luminance viewing angle in the second direction, and L min denotes smaller one of the 45-degree luminance viewing angle in the first direction and the 45-degree luminance viewing angle in the second direction.

(4) The light-emitting device according to any one of (1) to (3), in which each of the light-emitting elements has an organic light-emitting layer including a coated film.

(5) The light-emitting device according to any one of (1) to (4), in which the openings have constant pitches in the first direction and the second direction.

(6) The light-emitting device according to any one of (1) to (5), further including a pixel regulator that defines the light-emitting elements in the first direction, and defines widths of the respective light-emitting elements in the first direction.

(7) The light-emitting device according to any one of (1) to (6), in which resolution of the pixels is 100 ppi or more.

(8) An electronic apparatus with a light-emitting device as a display device, the light-emitting device including a plurality of pixels each including a plurality of subpixels, each of the subpixels including
a plurality of light-emitting elements that emits respective pieces of light of colors different from each other, and
a light-shielding film having a plurality of openings, the openings being provided at respective positions at which the openings are opposed to the respective light-emitting elements at a predetermined interval, the openings having respective widths that are different from each other, the widths of the respective openings in a first direction and a second direction being sized to allow the light-shielding film to block a portion of the pieces of light emitted from the respective light-emitting elements and thereby to cause a 45-degree luminance viewing angle in the first direction and a 45-degree luminance viewing angle in the second direction to be different, the 45-degree luminance viewing angle being expressed in a unit of $cd/m^2$, the widths of the respective openings in the first direction and the second direction being sized to cause color differences ($\Delta u'v'$) at a 45-degree chromaticity viewing angle ($u'v'$) in the first direction and the second direction to be 0.020 or less.

In the light-emitting device and the electronic apparatus according to an example embodiment of the disclosure, the widths of the respective openings of the light-shielding film in the first direction and the second direction are sized to allow the light-shielding film to block a portion of the pieces of light emitted from the respective light-emitting elements and thereby to cause the 45-degree luminance viewing angle ($cd/m^2$) to be different between the first direction and the second direction. The widths of the respective openings in the first direction and the second direction are further sized to cause color differences at the 45-degree chromaticity viewing angle ($u'v'$) in the first direction and the second direction to be 0.020 or less. This allows a color shift to be reduced even if the light-shielding film causes vignetting (light shielding) in a case where each of the openings of the light-shielding film is reduced in size.

The light-emitting device and the electronic apparatus according to an example embodiment of the disclosure each allow a color shift to be reduced even if each of the openings of the light-shielding film are reduced in size and the light-shielding film causes vignetting (light shielding). This suppresses or prevents a decrease in image grade at high resolution.

Although the disclosure is described hereinabove in terms of example embodiments and modification examples, it is not limited thereto. It should be appreciated that variations may be made in the example embodiments and modification examples described herein by persons skilled in the art without departing from the scope of the disclosure as defined by the following claims. The limitations in the claims are to be interpreted broadly based on the language employed in the claims and not limited to examples described in this specification or during the prosecution of the application, and the examples are to be construed as non-exclusive. For example, in this disclosure, the use of the terms first, second, etc. do not denote any order or importance, but rather the terms first, second, etc., are used to distinguish one element from another. The term "disposed on/provided on/formed on" and its variants as used herein refer to elements disposed directly in contact with each other or indirectly by having intervening structures therebetween. Moreover, no element or component in this disclosure is intended to be dedicated to the public regardless of whether the element or component is explicitly recited in the following claims.

What is claimed is:

1. A light-emitting device comprising
a plurality of pixels each including a plurality of subpixels,
each of the subpixels including
a plurality of light-emitting elements that emit respective pieces of light of colors different from each other, and
a light-shielding film having a plurality of openings, the openings being provided at respective positions at which the openings are opposed to the respective light-emitting elements at a predetermined interval, the openings having respective widths that are different from each other,
the widths of the respective openings in a first direction and a second direction being sized to allow the light-shielding film to block a portion of the pieces of light emitted from the respective light-emitting elements and thereby to cause a 45-degree luminance viewing angle in the first direction and a 45-degree luminance viewing angle in the second direction to be different, the 45-degree luminance viewing angle being expressed in a unit of cd/m2,
the widths of the respective openings in the first direction and the second direction being sized to cause color differences ($\Delta u'v'$) at a 45-degree chromaticity viewing angle ($u'v'$) in the first direction and the second direction to be 0.020 or less.

2. The light-emitting device according to claim 1, wherein the widths of the respective openings in the first direction and the second direction are sized to cause the color differences to be 0.004 or less.

3. The light-emitting device according to claim 1, wherein the widths of the respective openings in the first direction and the second direction are sized to cause a luminance difference $\Delta L$ at the 45-degree luminance viewing angle to exceed 3% in any of the colors of the respective pieces of light that are emitted,
the luminance difference $\Delta L$ being obtained from the following expression:

$$\Delta L = ((L\,\text{max} - L\,\text{min})/L\,\text{max}) \times 100$$

where L max denotes larger one of the 45-degree luminance viewing angle in the first direction and the 45-degree luminance viewing angle in the second direction, and L min denotes smaller one of the 45-degree luminance viewing angle in the first direction and the 45-degree luminance viewing angle in the second direction.

4. The light-emitting device according to claim 1, wherein each of the light-emitting elements has an organic light-emitting layer including a coated film.

5. The light-emitting device according to claim 1, wherein the openings have constant pitches in the first direction and the second direction.

6. The light-emitting device according to claim 1, further comprising a pixel regulator that defines the light-emitting elements in the first direction, and defines widths of the respective light-emitting elements in the first direction.

7. The light-emitting device according to claim 1, wherein resolution of the pixels is 100 ppi or more.

8. An electronic apparatus with a light-emitting device as a display device, the light-emitting device comprising a plurality of pixels each including a plurality of subpixels, each of the subpixels including
- a plurality of light-emitting elements that emit respective pieces of light of colors different from each other, and
- a light-shielding film having a plurality of openings, the openings being provided at respective positions at which the openings are opposed to the respective light-emitting elements at a predetermined interval, the openings having respective widths that are different from each other, the widths of the respective openings in a first direction and a second direction being sized to allow the light-shielding film to block a portion of the pieces of light emitted from the respective light-emitting elements and thereby to cause a 45-degree luminance viewing angle in the first direction and a 45-degree luminance viewing angle in the second direction to be different, the 45-degree luminance viewing angle being expressed in a unit of cd/m2, the widths of the respective openings in the first direction and the second direction being sized to cause color differences (Δu'v') at a 45-degree chromaticity viewing angle (u'v') in the first direction and the second direction to be 0.020 or less.

* * * * *